(12) United States Patent
Sarkar et al.

(10) Patent No.: US 12,310,138 B2
(45) Date of Patent: May 20, 2025

(54) PHOTOSENSOR HAVING A SCATTERING STRUCTURE COMPRISES CIRCULAR RING AND PERIPHERAL PATTERNS

(71) Applicant: Powerchip Semiconductor Manufacturing Corporation, Hsinchu (TW)

(72) Inventors: Eknath Sarkar, New Taipei (TW); Yichen Ma, Taipei (TW); Yu-Chieh Lee, Taipei (TW); Chee-Wee Liu, Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 471 days.

(21) Appl. No.: 17/969,663

(22) Filed: Oct. 19, 2022

(65) Prior Publication Data
US 2024/0136382 A1 Apr. 25, 2024
US 2024/0234465 A9 Jul. 11, 2024

(51) Int. Cl.
*H10F 39/00* (2025.01)

(52) U.S. Cl.
CPC ....... *H10F 39/807* (2025.01); *H10F 39/8063* (2025.01); *H10F 39/811* (2025.01)

(58) Field of Classification Search
CPC ........ H10F 39/024; H10F 39/12; H10F 39/18; H10F 39/802; H10F 39/806; H10F 39/8063; H10F 39/807
USPC .......................................................... 257/444
See application file for complete search history.

(56) References Cited

U.S. PATENT DOCUMENTS

| | | | |
|---|---|---|---|
| 10,224,364 | B2 | 3/2019 | Zhao et al. |
| 10,504,952 | B2 | 12/2019 | Cheng et al. |
| 2020/0016574 | A1 | 1/2020 | Kovacic et al. |
| 2022/0149098 | A1 | 5/2022 | Wang et al. |

(Continued)

FOREIGN PATENT DOCUMENTS

| | | |
|---|---|---|
| TW | 201929209 | 7/2019 |
| TW | I685986 | 2/2020 |
| TW | 202209661 | 3/2022 |

OTHER PUBLICATIONS

"Office Action of Taiwan Counterpart Application", issued on Aug. 15, 2023, p. 1-p. 9.

(Continued)

*Primary Examiner* — Hoai V Pham
(74) *Attorney, Agent, or Firm* — JCIPRNET

(57) ABSTRACT

A photosensor provided herein includes a sensing structure and a microlens. The sensing structure includes an epitaxial layer, a deep trench and a scattering structure. The epitaxial layer has an illuminated surface and a non-illuminated surface. The deep trench isolation is located along an edge of the epitaxial layer. The scattering structure is embedded in the epitaxial layer and extends inwardly from the illuminated surface. The scattering structure includes a first circular ring pattern and a peripheral pattern. The deep trench isolation surrounds the scattering structure, the peripheral pattern is connected with the deep trench isolation and the first circular ring pattern is separated from the peripheral pattern and the deep trench isolation. The microlens is disposed on the epitaxial layer, wherein the illuminated surface of the epitaxial layer is relatively close to the microlens than the non-illuminated surface.

20 Claims, 26 Drawing Sheets

(56) References Cited

U.S. PATENT DOCUMENTS

2022/0149221 A1    5/2022  Kurata et al.
2025/0056913 A1*   2/2025  Takai ................... H04N 25/705

OTHER PUBLICATIONS

I. Oshiyama et al., "Near-infrared sensitivity enhancement of a back-illuminated complementary metal oxide semiconductor image sensor with a pyramid surface for diffraction structure," 2017 IEEE International Electron Devices Meeting (IEDM), Dec. 2017, pp. 1-4.
Ekaterina Ponizovskaya Devine et al., "Single Microhole per Pixel in CMOS Image Sensor with Enhanced Optical Sensitivity in Near-Infrared," IEEE Sensors Journal, vol. 21, May 2021, pp. 10556-10562.
Jonghoon Park et al., "Pixel Technology for Improving IR Quantum Efficiency of Backside-illuminated CMOS Image Sensor," International Image Sensor Society, 2019, pp. 1-4.
Jungwook Lim et al., "A single chip PPG sensor with enhanced IR sensitivity for low power and small size," Electronic Imaging, Jan. 2021, pp. 1-5.
Tae-Yon Lee et al., "Quantum Efficiency and Optical Cross-talk of Pixels with Backside Scattering Technique for Near-Infrared Imaging," International Image Sensor Society, 2021, pp. 1-4.

* cited by examiner

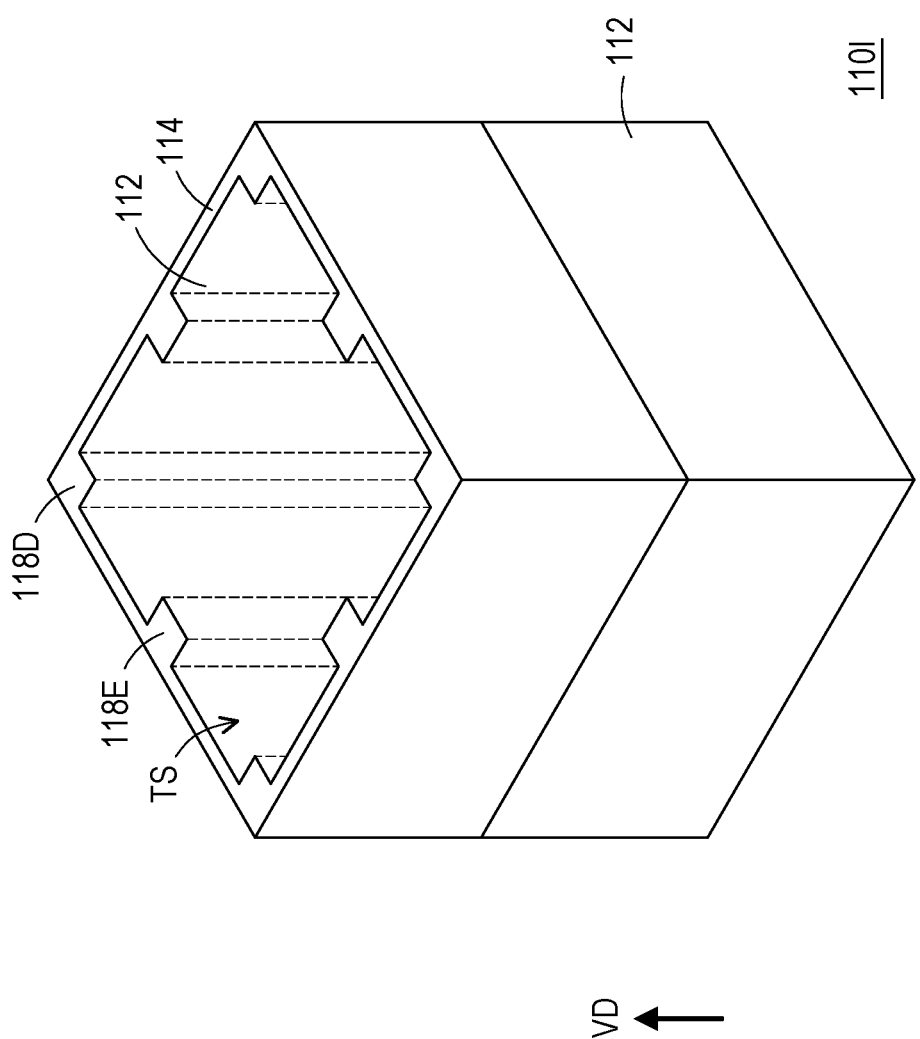

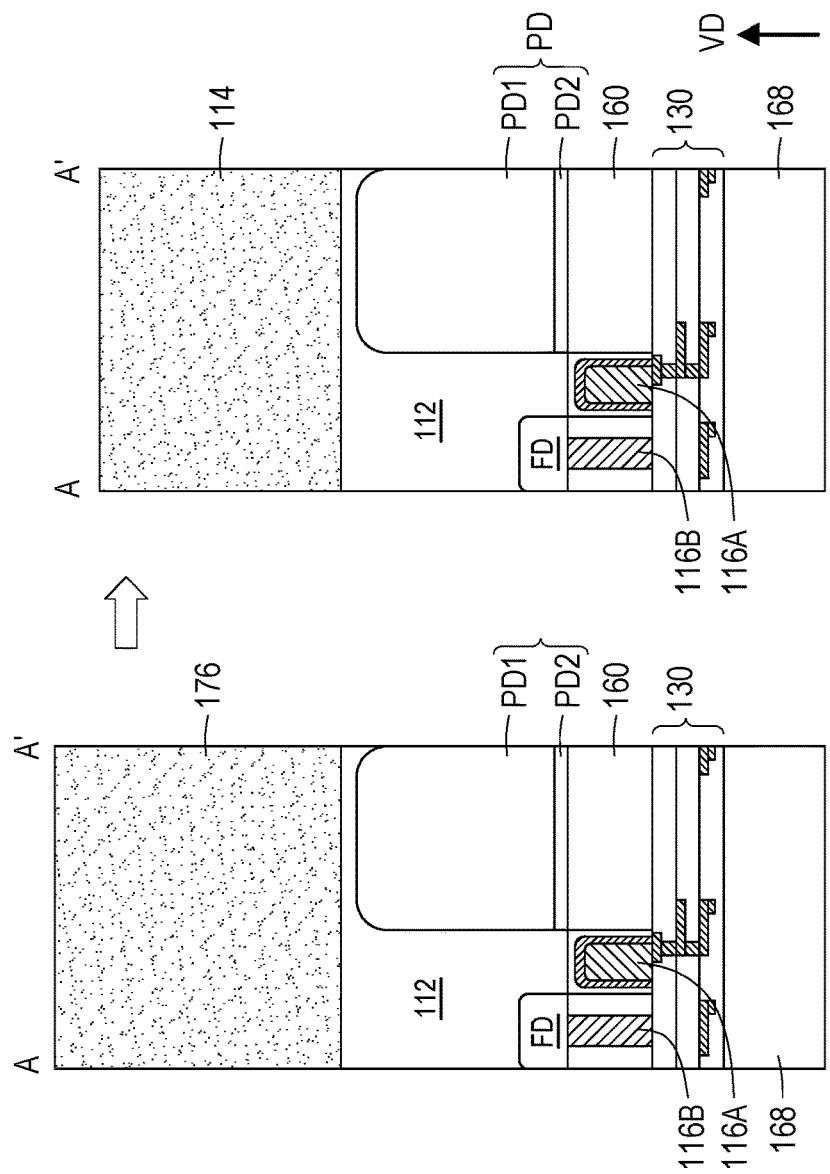
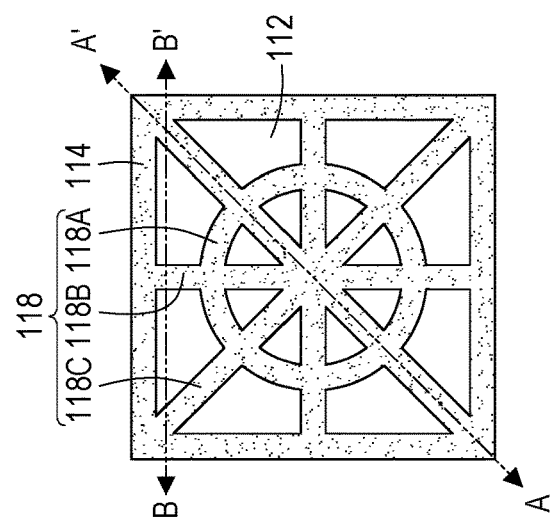
FIG. 6A
FIG. 6B

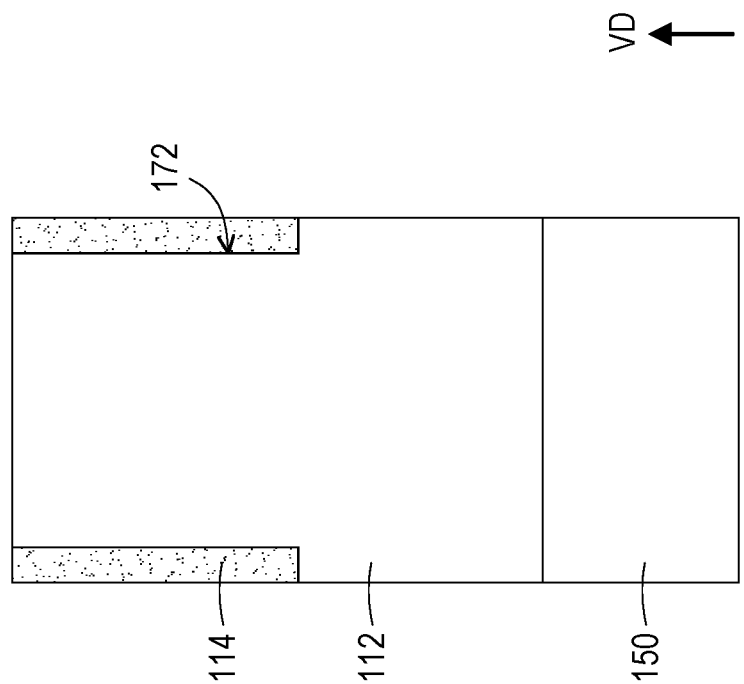
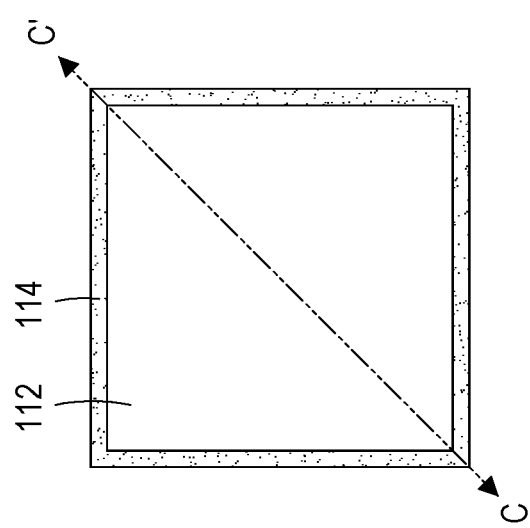
FIG. 8B
FIG. 8A

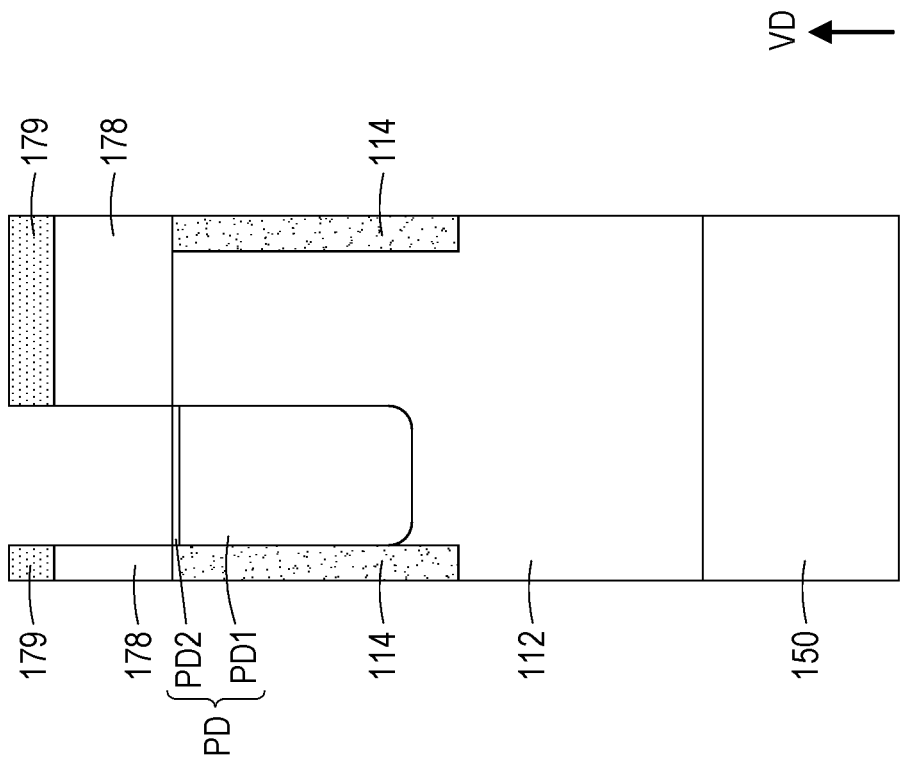
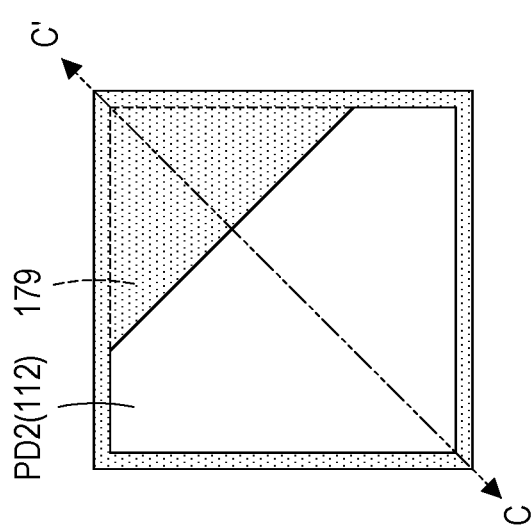
FIG. 9A
FIG. 9B

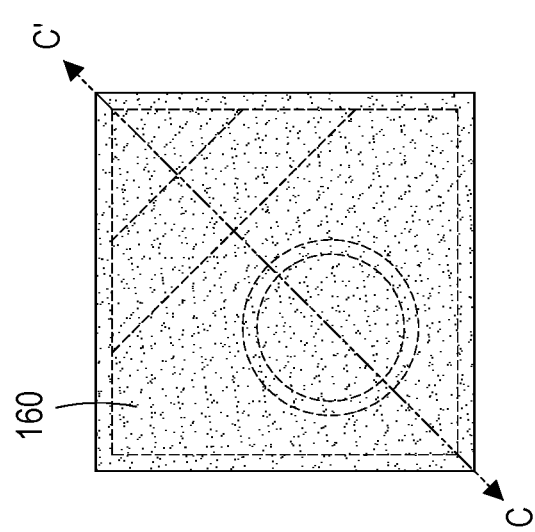
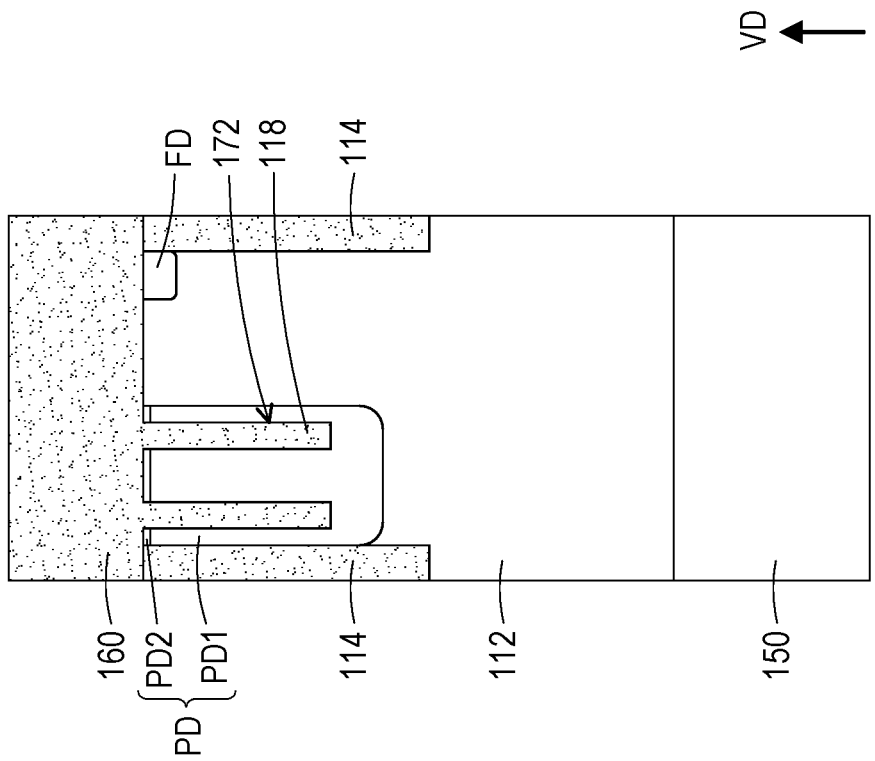
FIG. 12A
FIG. 12B

PHOTOSENSOR HAVING A SCATTERING STRUCTURE COMPRISES CIRCULAR RING AND PERIPHERAL PATTERNS

BACKGROUND

Technical Field

The disclosure is related to a sensor device and particularly to a photosensor

Description of Related Art

With the rapid development of the technology, photo sensors are improved to have higher resolution and are applicable in various fields. In some applications, the photosensor requires to be operated under various environments, for example, under a low light environment, a bright environment, or the like. Therefore, the sensitivity of the photosensor is a considerable term for designing and developing photosensors.

SUMMARY

The disclosure is related to a photosensor having a scattering structure to improve the quantum efficiency of the photosensor.

In an embodiment of the disclosure, a photosensor includes a sensing structure and a microlens. The sensing structure includes an epitaxial layer, a deep trench and a scattering structure. The epitaxial layer has an illuminated surface and a non-illuminated surface. The deep trench isolation is located along an edge of the epitaxial layer. The scattering structure is embedded in the epitaxial layer and extends inwardly from the illuminated surface. The scattering structure includes a first circular ring pattern and a peripheral pattern. The deep trench isolation surrounds the scattering structure, the peripheral pattern is connected with the deep trench isolation and the first circular ring pattern is separated from the peripheral pattern and the deep trench isolation. The microlens is disposed on the epitaxial layer, wherein the illuminated surface of the epitaxial layer is relatively close to the microlens than the non-illuminated surface.

In light of the foregoing, the photosensor in accordance with some embodiments of the disclosure has a scattering structure embedded in the epitaxial layer and the scattering structure has complicated pattern for scattering the incoming light. Accordingly, the traveling path of the incoming light (i.e. the optical length of the light) is lengthened to improve the quantum efficiency of the photosensor. Accordingly, the sensitivity of the photosensor is enhanced. The photosensor may perform well under a relative low light environment.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A to FIG. 2K schematically illustrate several sensing structures in accordance with various embodiments.

FIG. 6A to FIG. 6C schematically illustrate several steps of fabricating a photosensor in accordance with some embodiments.

FIGS. 8A and 8B schematically illustrate a step of fabricating a photosensor in accordance with some embodiments of the disclosure.

FIGS. 9A and 9B schematically illustrate a step of fabricating a photosensor in accordance with some embodiments of the disclosure.

FIGS. 12A and 12B schematically illustrate a step of fabricating a photosensor in accordance with some embodiments of the disclosure.

DESCRIPTION OF THE EMBODIMENTS

Figure 1A:
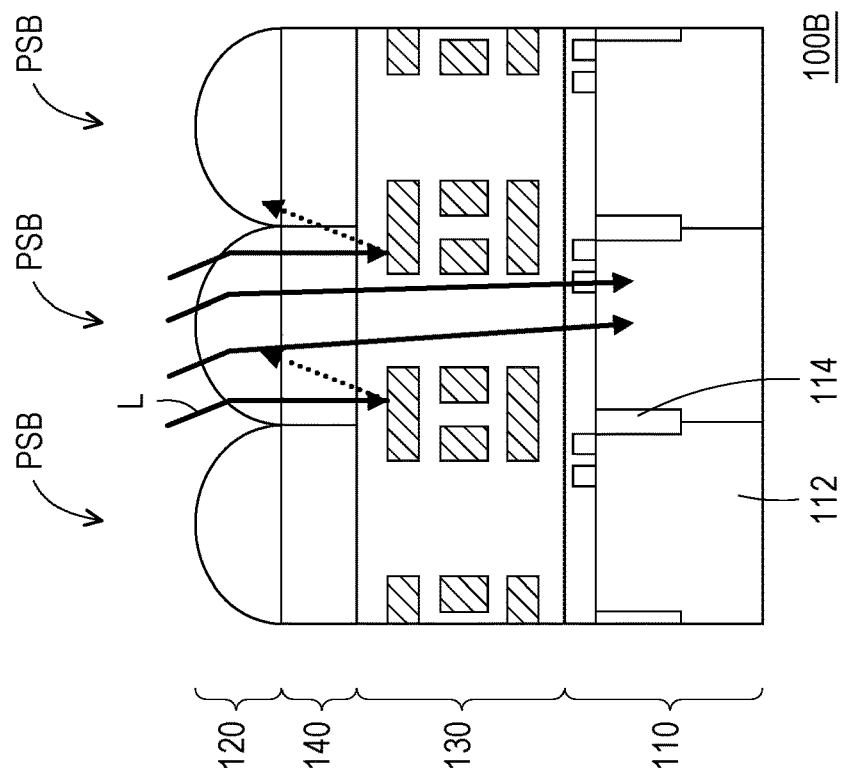
FIG. 1A and FIG. 1B respectively illustrate a cross-sectional sideview of a portion of a photosensor array in accordance with some embodiments of the disclosure.
Figure 1B:
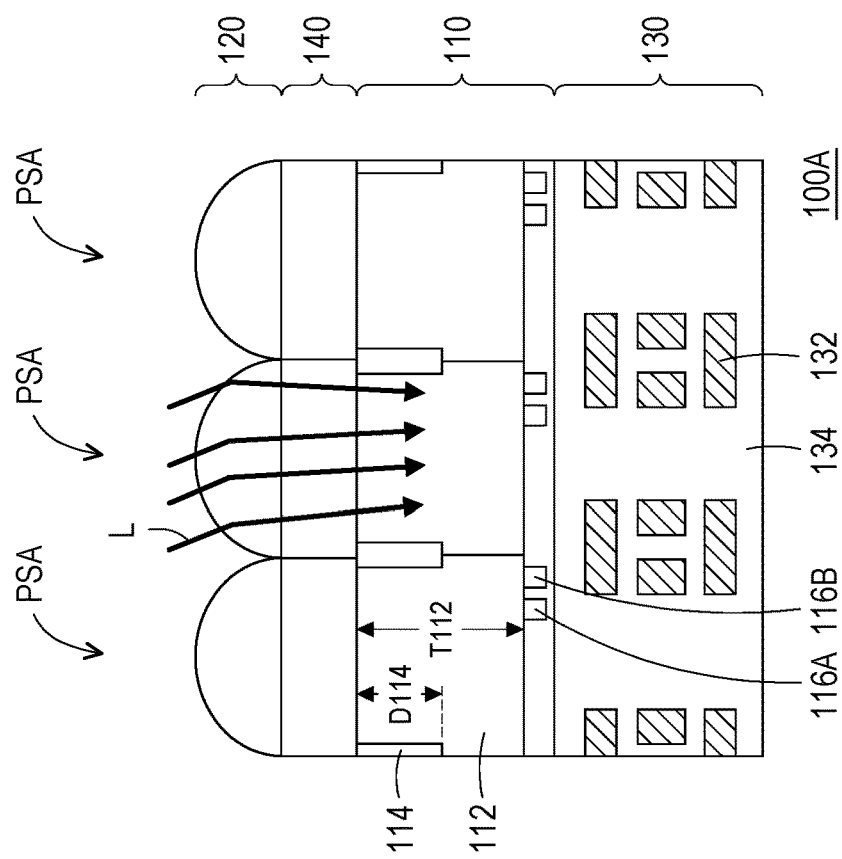

FIG. 1A and FIG. 1B respectively illustrate a cross sectional sideview of a portion of a photosensor array in accordance with some embodiments of the disclosure. In FIG. 1A, a photosensor array 100A includes a plurality of photosensors PSA arranged in an array. The quantity of the photosensors PSA in the photosensor array is more than three and FIG. 1A only presents three sensors for illustrative purposes. Each of the photosensors PSA may include a sensing structure 110, a microlens 120, an interconnect structure 130, and an optical layer 140. The sensing structure 110 is disposed between the interconnect structure 130 and the microlens 120. The optical layer 140 is disposed between the microlens 120 and the sensing structure 110. Accordingly, the external light L passing through the microlens 120 and the optical layer 140 would enter the sensing structure 110 without passing through the interconnect structure 130, which helps to improve the amount of light receiving surface of the sensing structure 110 to enhance the sensitivity of the photosensor PSA. Specifically, the external light L enters the sensing structure 110 from a backside which is opposite to the side connected to the interconnect structure 130 so that the photosensors PSA of the photosensor array 100A are backside illuminated type (BSI) photosensors.

The sensing structure 110 may include an epitaxial layer 112 and a deep trench isolation 114. The epitaxial layer 112 is made of a semiconductor material such as silicon and partially doped with required dopants to form a photodiode. The deep trench isolation 114 isolates the epitaxial layer 112 of one photosensor PSA from the epitaxial layer 112 of an adjacent photosensor PSA. In addition, the sensing structure 110 in each photosensor PSA may further include a transfer gate (TG) structure 116A and a floating diffusion (FD) contact 116B. The gate structure 116A and the floating diffusion contact 116B are disposed on the epitaxial layer 112 and enable the operation of the photosensor PSA. The epitaxial layer 112 may have a thickness of 10 nm-10 μm and the depth D114 of the deep trench isolation 114 may be 10 nm-10 μm. The deep trench isolation 114 forms a frame structure surrounding the epitaxial layer 112 to define a pixel of the photosensor PSA. In other words, the pixel area of the photosensor PSA is determined by the area surrounded by the deep trench isolation 114. In some embodiments, a fill factor is understood as the ratio of light-sensitive area of a pixel to total pixel area in an image sensor and the photosensor PSA in the photosensor array 100A may have the fill factor of about 100% since the microlens 120 and the optical layer 140 are light transparent components without blocking the external light L.

In some embodiments, the material of the deep trench isolation 114 may include silicon oxide ($SiO_2$), silicon nitride ($Si_3N_4$), hafnium oxide ($HfO_2$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like.

The epitaxial layer 112 are doped with required dopants to have doped regions (not shown) at the front side of the sensing structure 110 while no extra doping is needed underneath gate structure 116A, and the gate structure 116A and the floating diffusion contact 116B are disposed on the front side of the sensing structure 110 corresponding to the doped regions. The gate structure 116A may include a gate metal and a gate insulator disposed between the gate metal and the epitaxial layer 112, and the gate structure 116A is located between doped regions. The floating diffusion contact 116B is disposed on and in contact with the corresponding doped region of the epitaxial layer 112. The material of the gate metal may include TiN, Al, Ni, Pt, etc., and the material of the gate insulator may include $HfO_2$, $ZrO_2$, $Al_2O_3$, $SiO_2$, etc. or include any of the materials of the deep trench isolation 114. The material of the floating diffusion contact 116B may include TiN, Al, Cu, poly-Si(n) etc. In addition, the gate structure 116A and the floating diffusion contact 116B are electrically connected to the interconnect structure 130 to establish the required circuitry to drive the respective photosensor PSA.

The microlens 120 is disposed above the sensing structure 110 and has a curved surface for refracting the incoming external light L to travel toward the epitaxial layer 112 of the sensing structure 110 so that the microlens 120 helps to improve the light receiving amount of the sensing structure 110. In some embodiments, the material of the microlens 120 may include, but not limited to, glass, PMMA, AZP, etc. The curved surface of the micro lens 120 helps to concentrate the external light L travelling toward the epitaxial layer 112.

The interconnect structure 130 is disposed at the front side of the sensing structure 110 opposite to the microlens 120. In other words, the microlens 120 are disposed at the backside of the sensing structure 110. The interconnect structure 130 includes interconnect wirings 132 and interconnect dielectrics 134 separate different layers of the interconnect wirings 132 to establish the electric transmission paths for the photosensor PSA. For example, the interconnect wirings 132 establish the electric transmission paths electrically connected to the gate structure 116A and the floating diffusion contact 116B. In some embodiments, the material of the interconnect wirings 132 may include Al, Cu, etc. and the material of the interconnect dielectrics 134 may include dielectric oxides, nitrides or other dielectric material.

The optical layer 140 is disposed between the microlens 120 and the sensing structure 110. In some embodiments, the optical layer 140 may include a color filter and an anti-reflective structure. The color filter filters the wavelengths of the external light L to determine the color being sensed by the sensing structure 110. The anti-reflective structure reduces the reflection of the external light L so as to improve the light receiving amount of the sensing structure 110. The anti-reflective structure may be alternative stacks of $SiO_2$/$TiO_2$ and the stacks of $SiO_2$/$TiO_2$ forming the anti-reflective structures in different photosensors PSA are the same. The color filter may be implemented by alternative stacks of $SiO_2$/$TiO_2$. The stacks of $SiO_2$/$TiO_2$ for forming the color filter in one photosensor PSA may be different from that in an adjacent photosensor PSA so that different photosensors PSA are sensitive to different wavelengths of light. For example, the three photosensors PSA shown in FIG. 1A may respectively sensitive to red light, green light and blue light, but the disclosure is not limited thereto.

In FIG. 1B, a photosensor array 100B is similar to the photosensor array 100A, but is different from the photosensor array 100A in that the disposition sequency of the sensing structure 110 and the interconnect structure 130 in each photosensor PSB. Therefore, the same components are indicated by the same reference numbers in the two embodiments and the descriptions of the respective components in the two embodiments are applicable to both embodiments. Specifically, the photosensor array 100B include a plurality of photosensors PSB arranged in an array and FIG. 1B only show three photosensors PSB for illustrative purpose. Each of the photosensors PSB includes a sensing structure 110, a microlens 120, an interconnect structure 130, and an optical layer 140. The interconnect structure 130 is disposed between the microlens 120 and the sensing structure 110. The optical layer 140 is disposed between the microlens 120 and the interconnect structure 130. The external light L enters the sensing structure 110 from a frontside which is the side connected to the interconnect structure 130 so that the photosensors PSB of the photosensor array 100B are frontside illuminated type (FSI) photosensors.

For improving the sensitivity of the photosensors PSA and PSB, one approach is to increase the quantum efficiency (QE, the measure of the effectiveness of an imaging device to convert incident photons into electrons) of the photosensors PSA and PSB. Therefore, according to the following descriptions, each of the photosensors PSA and PSB further includes a scattering structure which helps to increase the travelling length of the light in the sensing structure 110 to increase light absorption of the photosensors PSA and PSB.

Figure 2A:
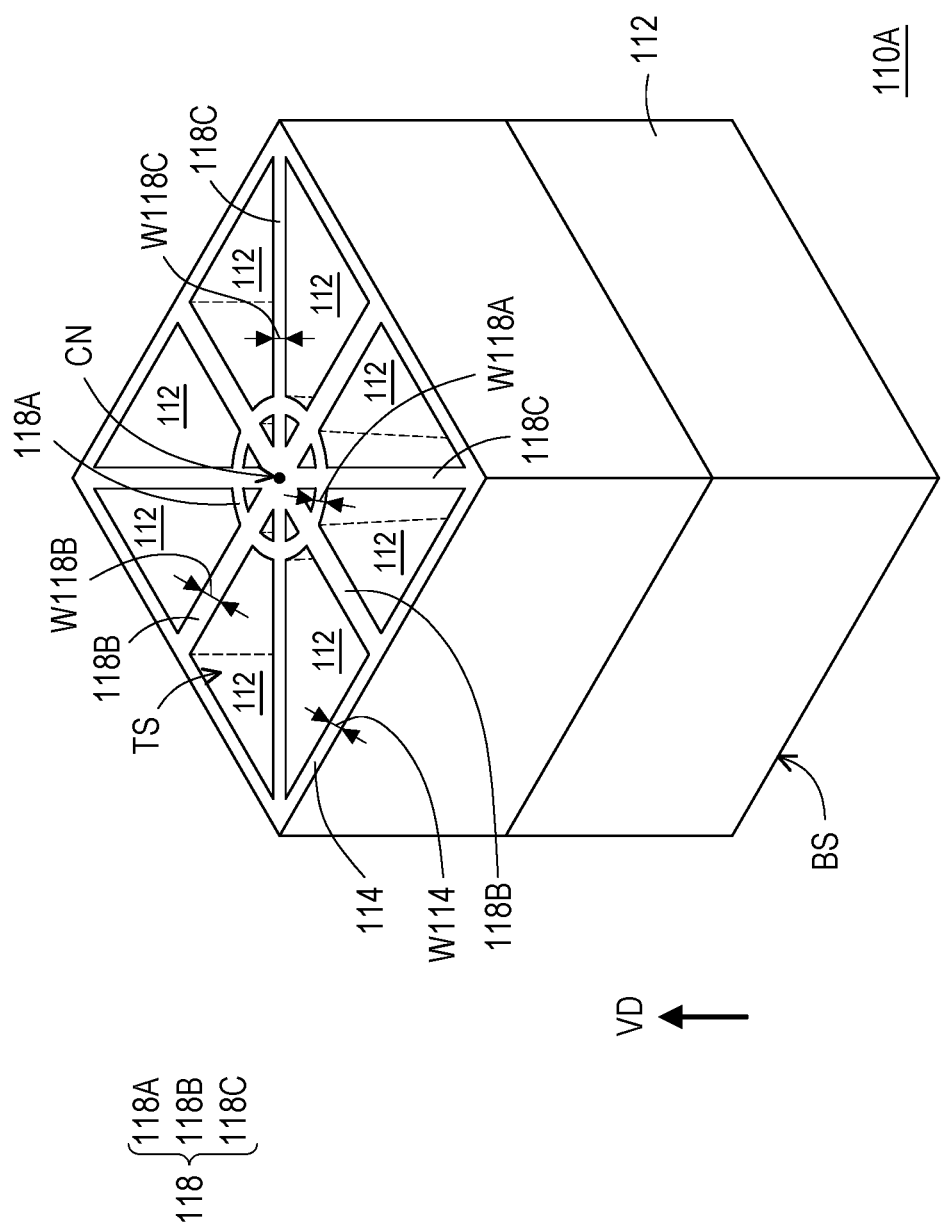

FIG. 2A to FIG. 2E schematically illustrate several sensing structures in accordance with various embodiments. Each of the sensing structures shown in FIG. 2A to FIG. 2E is applicable to the photosensor PSA in the photosensor array 100A or the photosensor PSB in photosensor array 100B and is considered as an implemental example of the sensing structure 110 of the photosensor PSA in the photosensor array 100A or the photosensor PSB in photosensor array 100B. In FIG. 2A, a sensing structure 110A includes an epitaxial layer 112, a deep trench isolation 114 and a scattering structure 118. The epitaxial layer 112 has an illuminated surface TS and a non-illuminated surface BS. In some embodiments, the sensing structure 110A is applicable to the photosensor PSA of the photosensor array 100A, and the illuminated surface TS is relatively close to the optical layer 140 (shown in FIG. 1A) than the non-illuminated surface BS. In some embodiments, the sensing structure 110A is applicable to the photosensor PSB of the photosensor array 100B, and the illuminated surface TS is closer to the interconnect structure 130 than the non-illuminated surface BS. In other words, when applied in the photosensor PSA of the photosensor array 100A or the photosensor PSB of photosensor array 100B, the illuminated surface TS is closer to the microlens 120 than the non-illuminated surface BS. The deep trench isolation 114 forms a frame structure surrounding the edge of the epitaxial layer 112. In some embodiments, a width W114 of the deep trench isolation 114 may be 10 nm-10 μm. The scattering structure 118 is embedded in the epitaxial layer 112 and particularly extends inwardly from the illuminated surface TS of the epitaxial layer 112.

In FIG. 2A, the scattering structure 118 includes a first circular ring pattern 118A and traversal patterns 118B and 118C and extends from the illuminated surface TS inwardly to be embedded in the epitaxial layer 112, wherein each of the traversal patterns 118B and 118C extends in an extending direction traversing the first circular ring pattern 118A. In some embodiments, the first circular ring pattern 118A is centered at a center point CN and the traversal patterns 118B and 118C extend across the center point CN. Specifically, the first circular ring pattern 118A is positioned at the center of the sensing structure 110A and forms a circular ring in the top view, but the disclosure is not limited thereto. The traversal patterns 118B extend along extending directions substantially parallel to the side edges of the sensing structure 110A and the traversal patterns 118C extend along extending directions substantially parallel to the diagonal lines of the sensing structure 110A. Therefore, the traversal patterns 118B form a "+" in the top view and the traversal patterns 118C form a "x" in the top view. In addition, the terminals of the traversal patterns 118B and 118C are connected to the deep trench isolation 114 so that the scattering structure 118 forms a continuous pattern in the top view, but not limited thereto. A width W118A of the first circular ring pattern 118A may be 10 nm-5 μm. A width W118B of the traversal patterns 118B and a width W118C of the traversal patterns 118C may be 10 nm-5 μm. The width W118B and the width W118C may be the same, but the disclosure is not limited thereto. In some embodiments, the width W118A, the width W118B and the width W118C may be changed along the vertical direction VD. Therefore, the scattering structure 118 may have taper sidewalls.

Figure 2B:
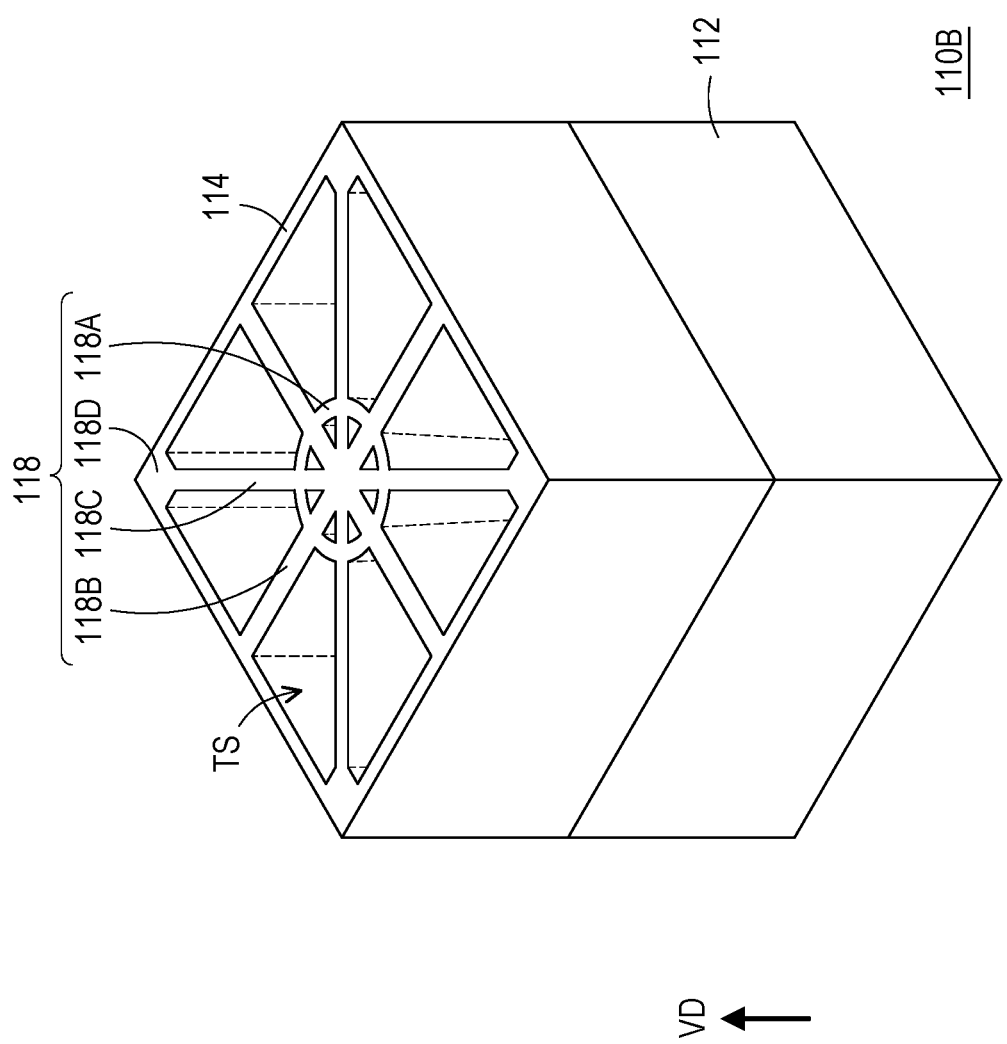

In FIG. 2B, a sensing structure 110B is similar to the sensing structure 110A and includes an epitaxial layer 112, a deep trench isolation 114 and a scattering structure 118. The dispositions of the epitaxial layer 112, the deep trench isolation 114 and the scattering structure 118 in the sensing structure 110A are applicable in the sensing structure 110B. Specifically, the scattering structure 118 of the sensing structure 110B includes a first circular ring pattern 118A and traversal patterns 118B and 118C and further includes peripheral patterns 118D. The first circular ring pattern 118A, the traversal patterns 118B and 118C and the peripheral patterns 118D respectively extend from the illuminated surface TS inwardly to be embedded in the epitaxial layer 112. Each of the peripheral patterns 118D is located at a terminal of one of the traversal patterns 118C, i.e. the peripheral patterns 118D are located at corners of the sensing structure 110B. The peripheral patterns 118D has a square shape in the top view, but the disclosure is not limited thereto. In some embodiments, a length and breadth of the peripheral patterns 118D may be 10 nm to 5 μm.

Figure 2C:
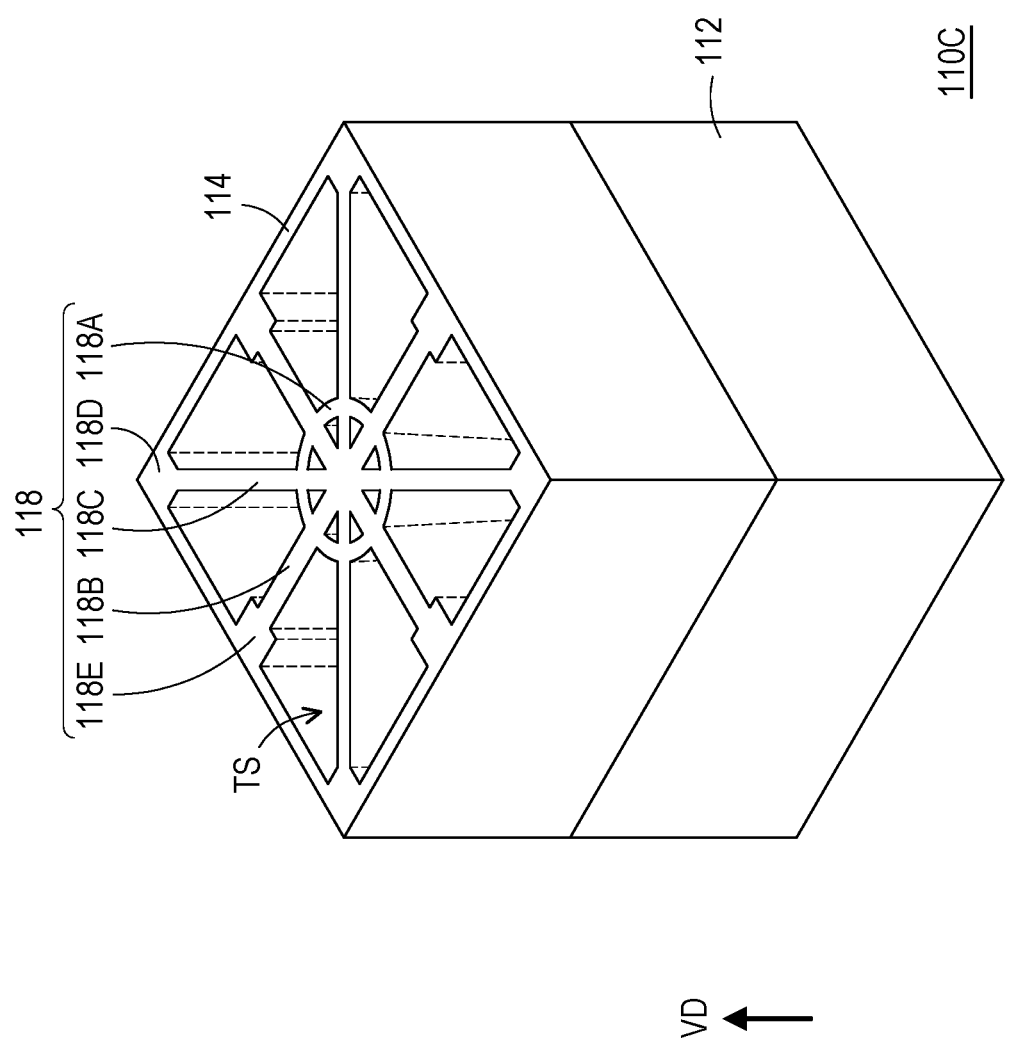

In FIG. 2C, a sensing structure 110C is similar to the sensing structure 110B and includes an epitaxial layer 112, a deep trench isolation 114 and a scattering structure 118 extending from the illuminated surface TS inwardly to be embedded in the epitaxial layer 112. The dispositions of the epitaxial layer 112, the deep trench isolation 114 and the scattering structure 118 in the sensing structure 110B are applicable in the sensing structure 110C. Specifically, the scattering structure 118 in the sensing structure 110C includes a first circular ring pattern 118A, traversal patterns 118B and 118C and peripheral patterns 118D and further includes peripheral patterns 118E. The peripheral patterns 118D are disposed at the terminals of the traversal patterns 118C and each of the peripheral patterns 118E is located at a terminal of one of the traversal patterns 118B. That is, the peripheral patterns 118D are located at corners of the sensing structure 110C and the peripheral patterns 118E are located at edges of the sensing structure 110C.

Figure 2D:
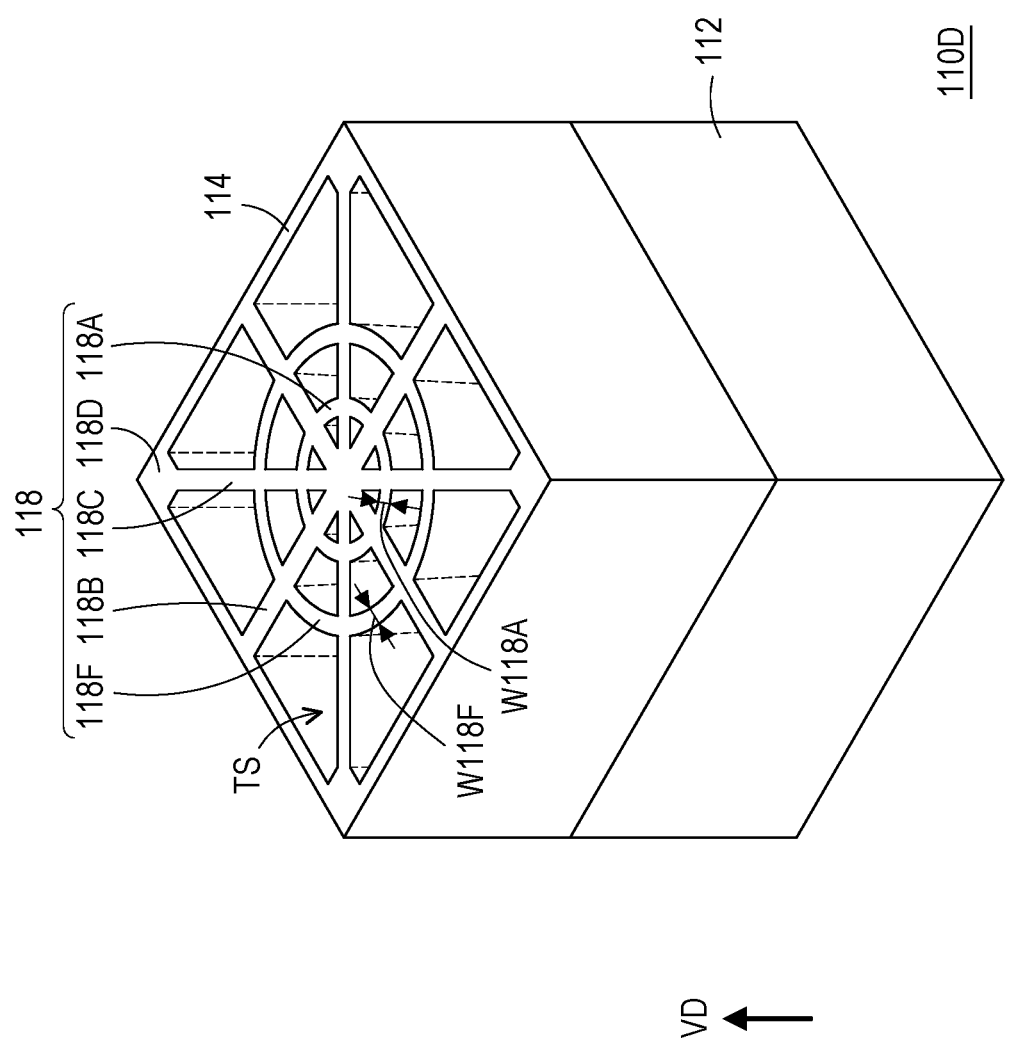

In FIG. 2D, a sensing structure 110D is similar to the sensing structure 110B and includes an epitaxial layer 112, a deep trench isolation 114 and a scattering structure 118 extending from the illuminated surface TS inwardly to be embedded in the epitaxial layer 112. The dispositions of the epitaxial layer 112, the deep trench isolation 114 and the scattering structure 118 in the sensing structure 110B are applicable in the sensing structure 110D. Specifically, the scattering structure 118 in the sensing structure 110D includes a first circular ring pattern 118A, traversal patterns 118B and 118C and peripheral patterns 118D and further includes a second circular ring pattern 118F. The second circular ring pattern 118F is substantially concentric to the first circular ring pattern 118A and a radius of the first circular ring pattern 118A is different from a radius of the second circular ring pattern 118F. The traversal patterns 118B and 118C all cross through the second circular ring pattern 118F. In some embodiments, a width W118F of the second circular ring pattern 118F may be 10 nm-5 μm. In some embodiments, a width W118A of the first circular ring pattern 118A may be the same as the width W118F of the second circular ring pattern 118F, but the disclosure is not limited thereto.

Figure 2E:
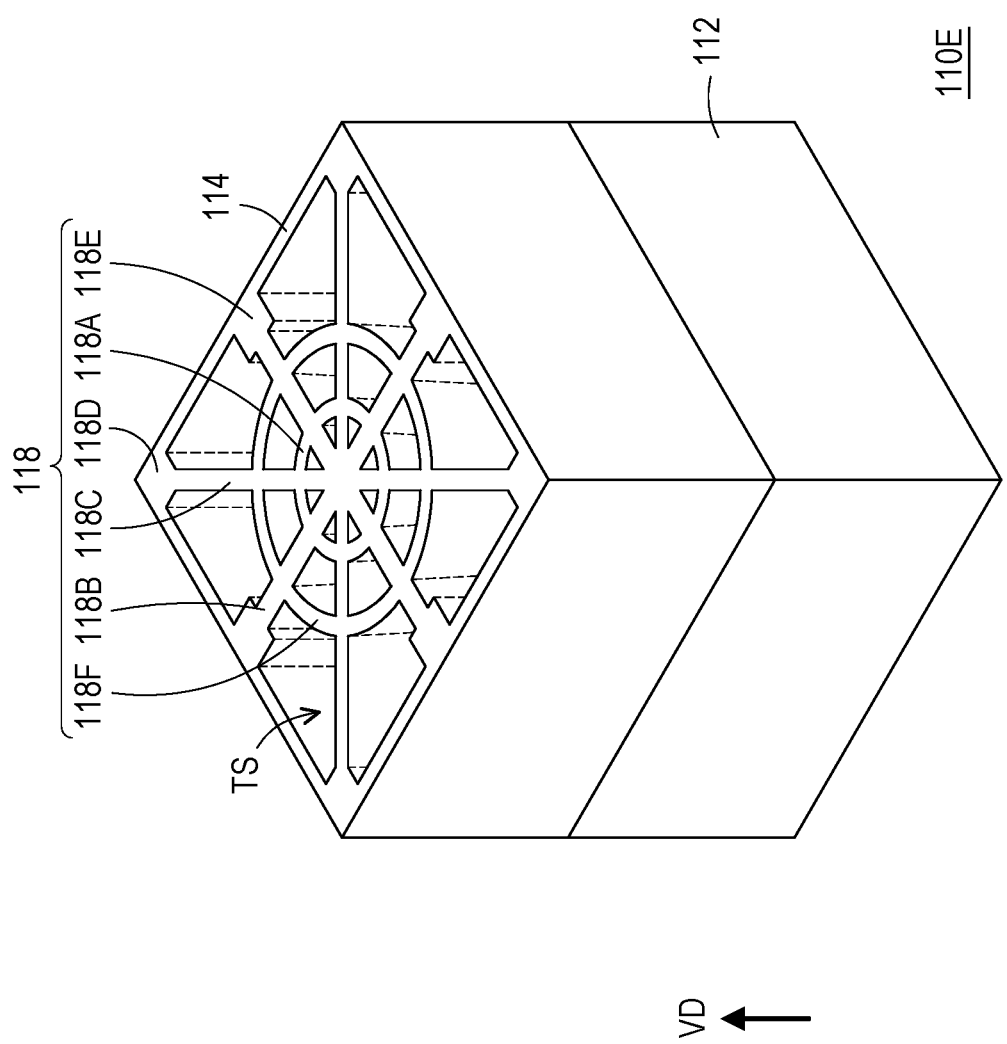

In FIG. 2E, a sensing structure 110E is similar to the sensing structure 110D and includes an epitaxial layer 112, a deep trench isolation 114 and a scattering structure 118 extending from the illuminated surface TS inwardly to be embedded in the epitaxial layer 112. The scattering structure 118 in the sensing structure 110E includes a first circular ring pattern 118A, a second circular ring pattern 118F, traversal patterns 118B and 118C and peripheral patterns 118D, and further includes peripheral patterns 118E. The peripheral patterns 118D are disposed at the terminals of the traversal patterns 118C and the peripheral patterns 118E are disposed at the terminals of the traversal patterns 118B.

Figure 2F:
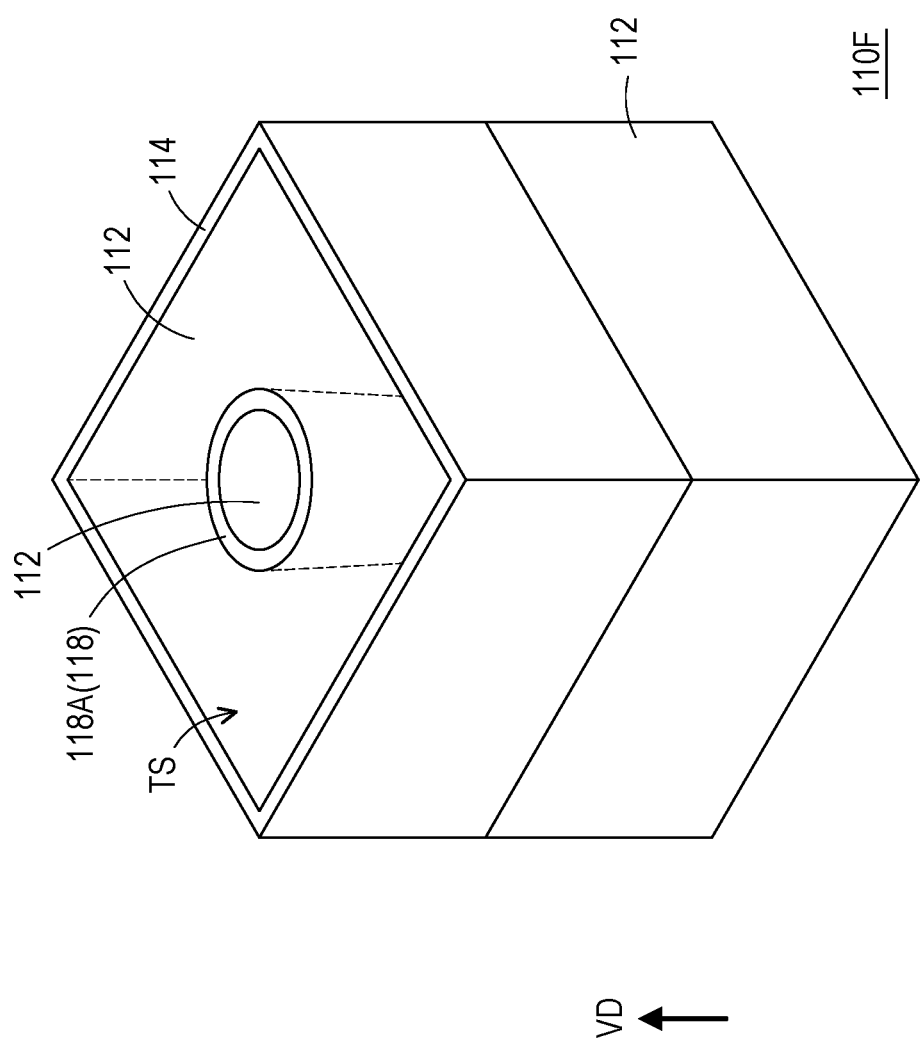

In FIG. 2F, a sensing structure 110F is similar to one of the sensing structures 110A to 100E and includes an epitaxial layer 112, a deep trench isolation 114 and a scattering structure 118. The scattering structure 118 in the sensing structure 110F includes a first circular ring pattern 118A and extends from an illuminated surface TS inwardly to be embedded in the epitaxial layer 112. The scattering structure 118 of the sensing structure 110F, i.e. first circular ring pattern 118A, is a completely unique structure and is spaced from the deep trench isolation 114.

Figure 2G:
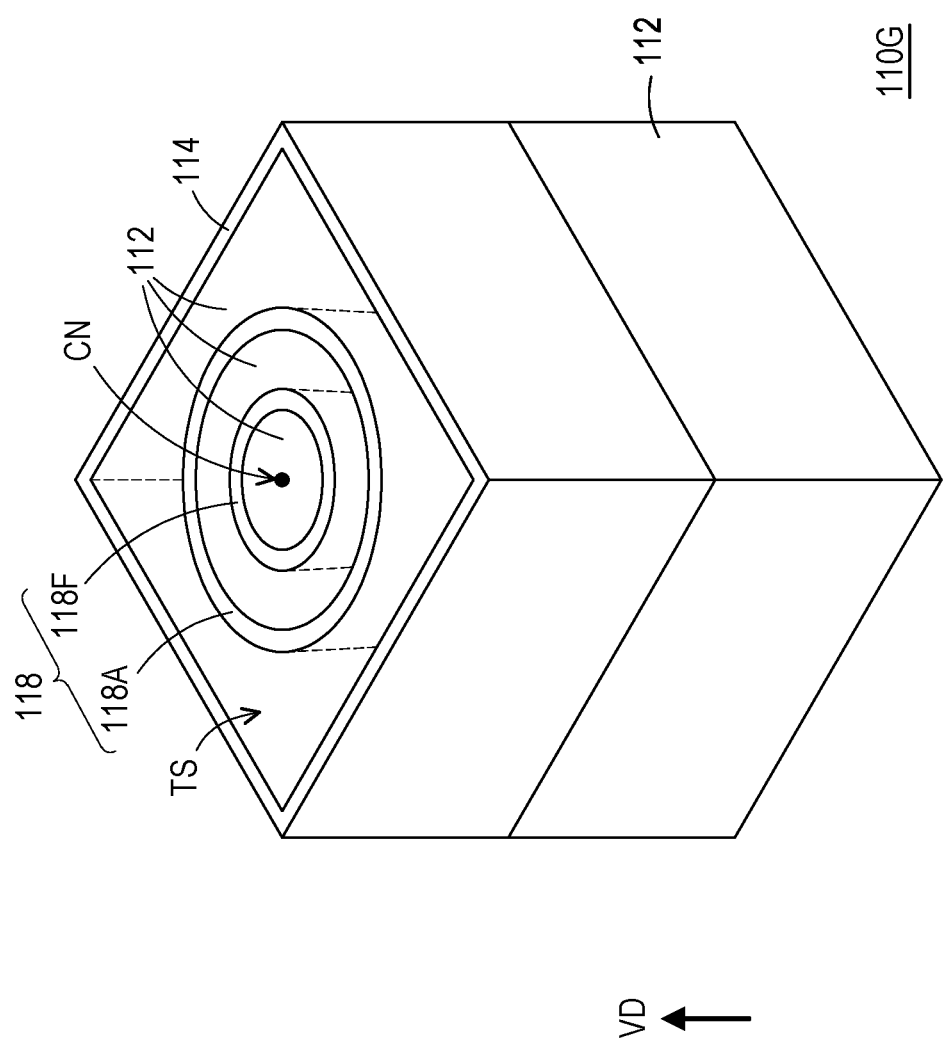

In FIG. 2G, a sensing structure 110G is similar to one of the sensing structures 110D and 100E and includes an epitaxial layer 112, a deep trench isolation 114 and a scattering structure 118. The scattering structure 118 in the sensing structure 110G includes a first circular ring pattern 118A and a second circular ring pattern 118F and extends from an illuminated surface TS inwardly to be embedded in the epitaxial layer 112. The first circular ring pattern 118A and the second circular ring pattern 118F are completely unique structures and are spaced from the deep trench isolation 114. The first circular ring pattern 118A and the second circular ring pattern 118F are centered at a center point CN, and a radius of the first circular ring pattern 118A is different from a radius of the second circular ring pattern 118F. For example, the radius of the first circular ring pattern 118A is smaller than the radius of the second circular ring pattern 118F.

Figure 2H:
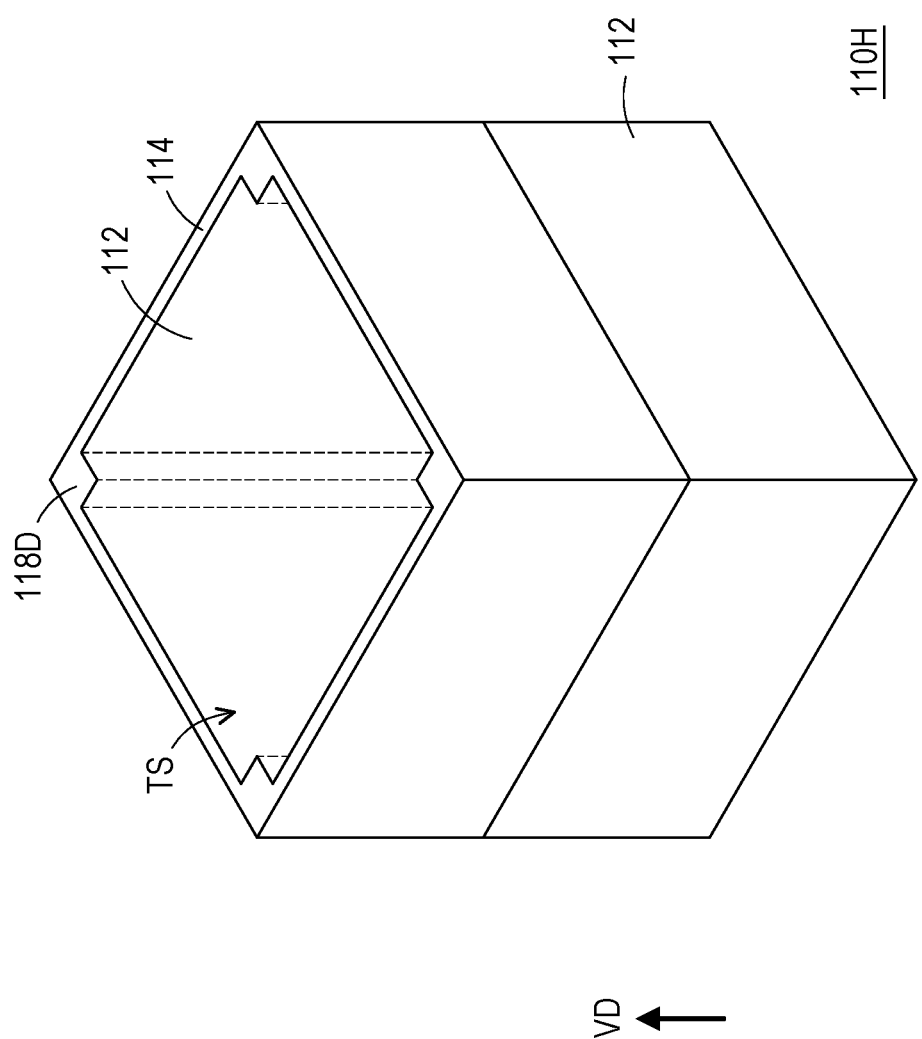

In FIG. 2H, a sensing structure 110H is similar to one of the sensing structures 110B to 100E and includes an epitaxial layer 112, a deep trench isolation 114 and a scattering structure 118. The scattering structure 118 in the sensing structure 110H includes peripheral patterns 118D and extends from an illuminated surface TS inwardly to be embedded in the epitaxial layer 112. The peripheral patterns 118D are connected with the deep trench isolation 114 and located at corners of the sensing structure 110H.

In FIG. 2I, a sensing structure 110I is similar to one of the sensing structures 110C and 100E and includes an epitaxial layer 112, a deep trench isolation 114 and a scattering structure 118. The scattering structure 118 in the sensing structure 110I includes peripheral patterns 118D and peripheral patterns 118E and extends from an illuminated surface TS inwardly to be embedded in the epitaxial layer 112. The peripheral patterns 118D are connected with the deep trench isolation 114 and located at corners of the sensing structure 110H. The peripheral patterns 118E are connected with the deep trench isolation 114 and located at edges of the sensing structure 110I.

Figure 2J:
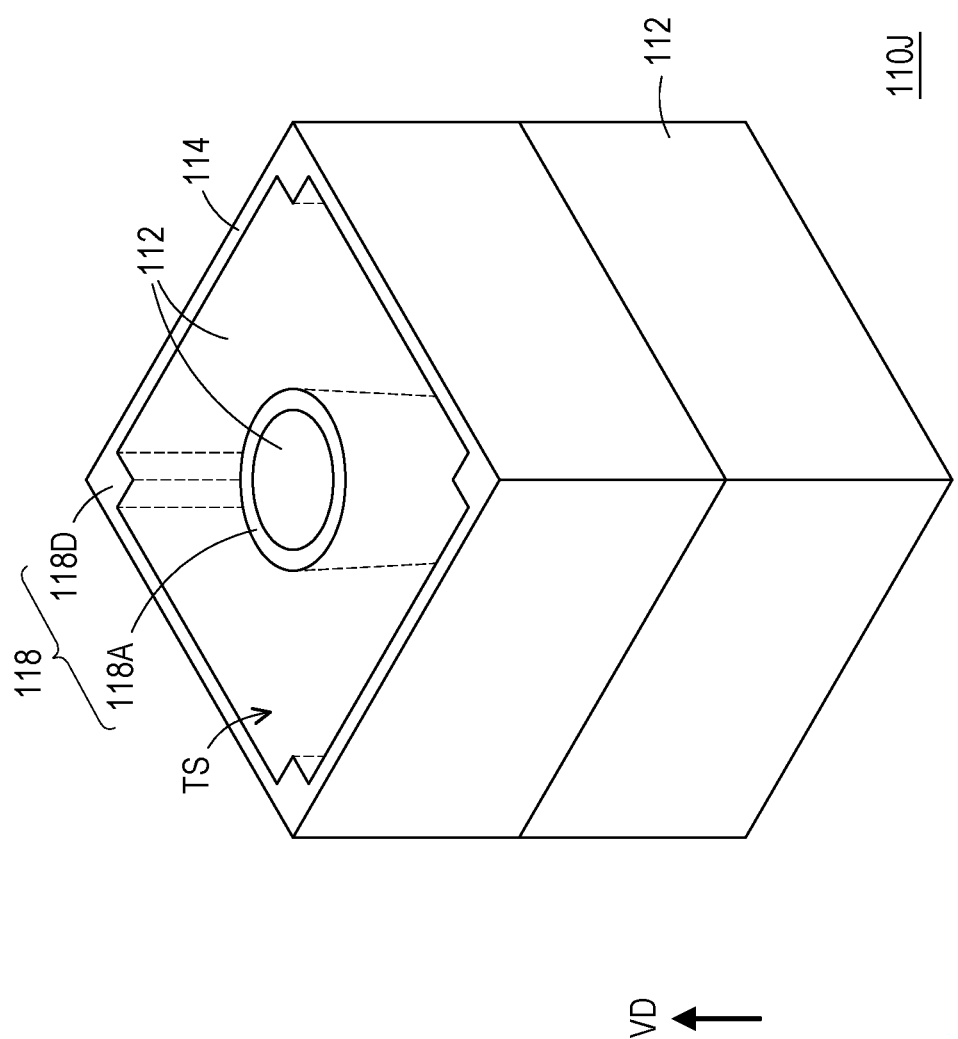

In FIG. 2J, a sensing structure 110J is similar to one of the sensing structures 110B to 100E and includes an epitaxial layer 112, a deep trench isolation 114 and a scattering structure 118. The scattering structure 118 in the sensing structure 110J includes a first circular ring patter 118A and peripheral patterns 118D. The first circular ring patter 118A and the peripheral patterns 118D extend from an illuminated surface TS inwardly to be embedded in the epitaxial layer 112. The first circular ring pattern 118A, is a completely unique structure and is spaced from the deep trench isolation 114. The peripheral patterns 118D are connected with the deep trench isolation 114 and located at corners of the sensing structure 110H.

Figure 2K:
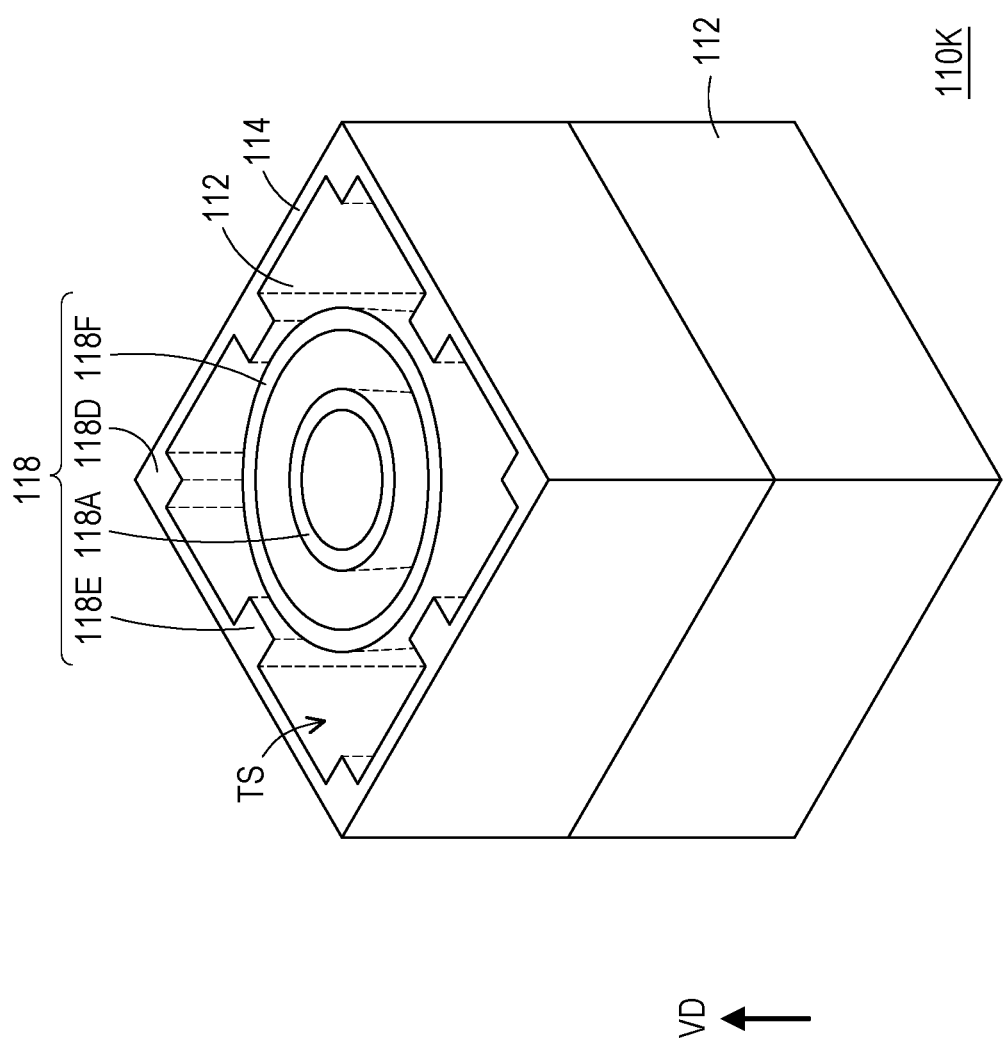

In FIG. 2K, a sensing structure 110K is similar to one of the sensing structures 110E and 100E and includes an epitaxial layer 112, a deep trench isolation 114 and a scattering structure 118. The scattering structure 118 in the sensing structure 110K includes a first circular ring patter 118A, a second circular ring pattern 118F, peripheral patterns 118D and peripheral patterns 118E that respectively extend from an illuminated surface TS inwardly to be embedded in the epitaxial layer 112. The first circular ring pattern 118A and the second circular ring pattern 118F are completely unique structures and are spaced from the deep trench isolation 114. The first circular ring pattern 118A and the second circular ring pattern 118F are centered at a center point CN, and the radius of the first circular ring pattern 118A is smaller than the radius of the second circular ring pattern 118F. The peripheral patterns 118D and the peripheral pattern 118E are connected with the deep trench isolation 114. The peripheral patterns 118D are located at corners of the sensing structure 110K and the peripheral patterns 118E are located at edges of the sensing structure 110K.

In some embodiments, the material of the scattering structure 118 shown in any of FIGS. 2A to 2K may include silicon oxide ($SiO_2$), silicon nitride ($Si_3N_4$), hafnium oxide ($HfO_2$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. In some embodiments, the material of the deep trench isolation 114 may be the same as or different from the material of the scattering structure 118. In some embodiments, the deep trench isolation 114 and the scattering structure 118 may be fabricated under the same fabrication steps. In some embodiments, the deep trench isolation 114 and the scattering structure 118 may be fabricated under different fabrication steps.

The scattering structure 118 in each of the sensing structures 110A to 110K is made of a material different from the epitaxial layer 112. A light irradiates on the interface between the scattering structure 118 and the epitaxial layer 112 is refracted and/or scattered so that the light refracted and/or scattered at the interface between the scattering structure 118 and the epitaxial layer 112 would travel in the epitaxial layer 112 longer, which helps to improve the quantum efficiency of the sensing structures 110A to 110K. The scattering structures 118 in the sensing structures 110A to 110E have different patterns and the area occupied by each of the scattering structures 118 may be not greater than 80% of the total area of the respective sensing structures 110A to 110K, but the disclosure is not limited thereto.

Figure 3:
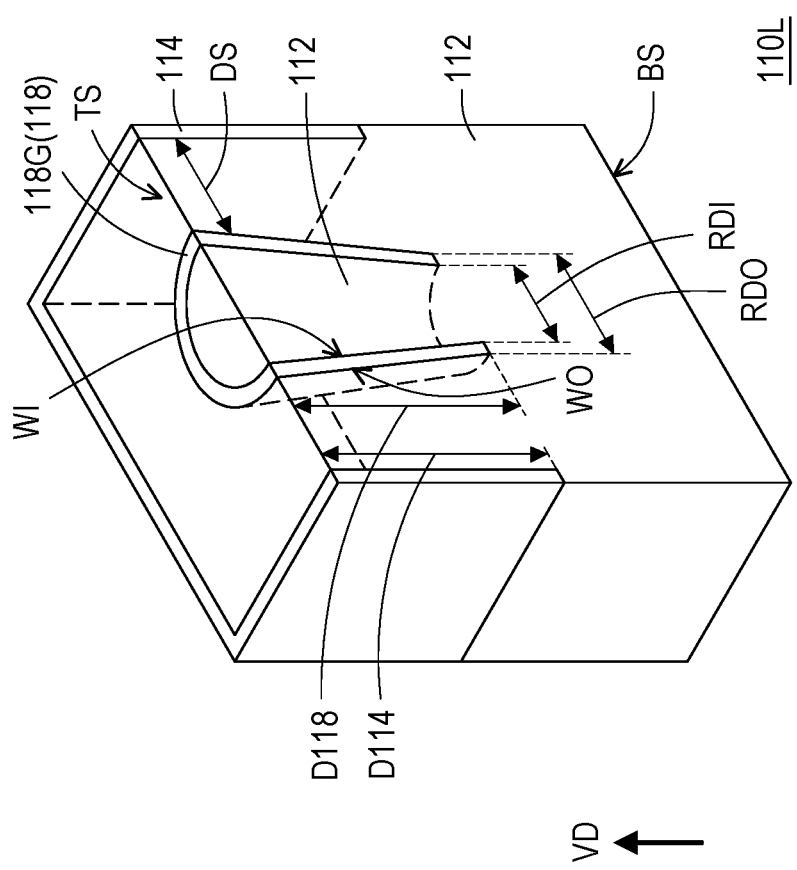
FIG. 3 schematically illustrates a cut sensing structure in accordance with some embodiments of the disclosure.

FIG. 3 schematically illustrates a cut sensing structure in accordance with some embodiments of the disclosure. In FIG. 3, a portion of a sensing structure 110L is shown while some components of the sensing structure 110L is omitted for illustrative purpose. The sensing structure 110L includes an epitaxial layer 112, a deep trench isolation 114, and a scattering structure 118. Specifically, the scattering structure 118 shown in FIG. 3 includes only one circular ring pattern 118G for descriptive purpose, and FIG. 3 is used for describing an exemplary implement of the cross section structure of the first circular ring pattern 118A or the second circular ring pattern 118F depicted in FIGS. 2A to 2G, 2J and 2K. However, the cross-section structures of other patterns such as the traversal patterns 118B and 118C, the peripheral patterns 118D and 118E or the like depicted in FIG. 2A to FIG. 2K may be implemented in a similar way.

As shown in FIG. 3, the circular ring pattern 118G have taper sidewalls such as the inner sidewall WI and the outer sidewall WO in the vertical direction VD. The inner sidewall WI and the outer sidewall WO each forms a funnel-like shape. Specifically, a radius RDI of the inner sidewall WI is gradually increased toward the illuminated surface TS of the sensing structure 110L in the vertical direction VD and a radius RDO of the outer sidewall WO is also gradually increased toward the illuminated surface TS of the sensing structure 110L in the vertical direction VD. In addition, a distance DS from the outer sidewall WO to the deep trench isolation 114 is gradually reduced toward the illuminated surface TS in the vertical direction VD. In some alternative embodiments, the radius RDI and the radius RDO may be identical in the vertical direction VD so that the circular ring pattern 118G has vertical sidewalls. In some further alternative embodiments, one or both of the radius RDI and the radius RDO may be gradually reduced toward the illuminated surface TS in the vertical direction VD. The depth D118 of the scattering structure 118 may be 10 nm-10 μm and the depth D114 of the deep trench isolation 114 may be nm-10 μm. In some embodiments, the depth D114 of the deep trench isolation 114 is not less than the depth D118 of the scattering structure 118.

According to the above embodiments, the scattering structure 118 includes complicate patterns and is embedded in the epitaxial layer 112. The material of the epitaxial layer 112 is a semiconductor material such as silicon, and the material of the scattering structure 118 is an insulation material such as oxides indicated in the above embodiments. A light such as a visible light or a near infrared light is scattered at the interface between the scattering structure 118 and the epitaxial layer 112 so that the travel path (optical path length) of the light travelling in the epitaxial layer 112 is lengthened to enhance the quantum efficiency of the epitaxial layer 112. Accordingly, the complicate scattering structure 118 helps to improve the sensitivity of the photosensors PSA and PSB (denoted in FIGS. 1A and 1B). For example, according to a simulation experiment, a comparative sensing structure having a scattering structure including only the traversal patterns 118B is compared with the sensing structure 110E having the scattering structure 118 with complicate patterns (a first circular ring pattern 118A, a second circular ring pattern 118F, traversal patterns 118B and 118C, peripheral patterns 118D, and peripheral patterns 118E). The quantum efficiency at 650 nm of wavelength of the sensing structure 110E is 17% higher than the comparative sensing structure.

Figure 4:
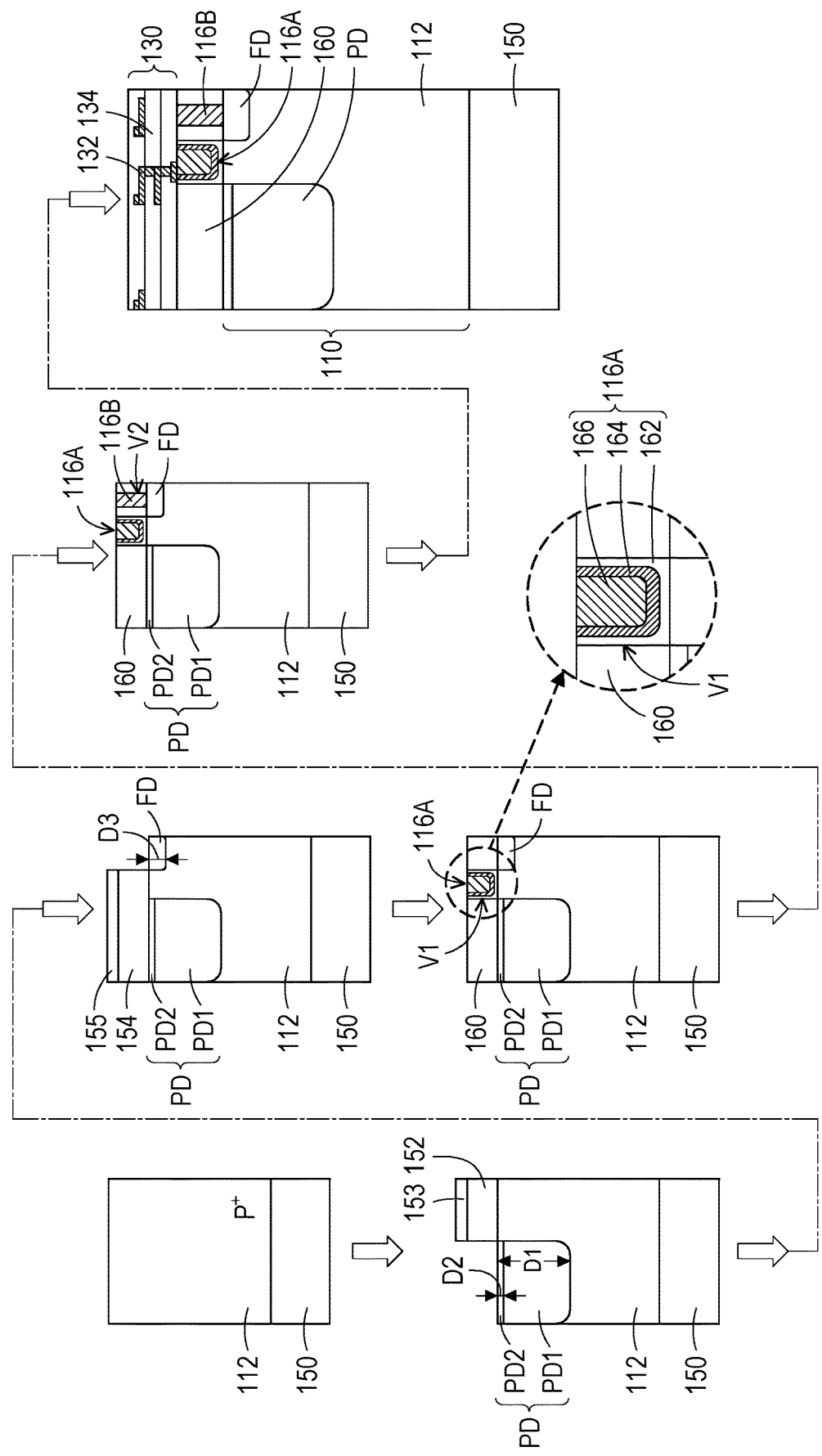
FIG. 4 schematically illustrate several steps of fabricating a photosensor in accordance with some embodiments.

FIG. 4-FIG. 6 schematically illustrate several steps of fabricating a BSI photosensor in accordance with some embodiments. In FIG. 4, a substrate 150 such as a wafer substrate is provided and an epitaxial layer 112 is deposited on the substrate 150. The epitaxial layer 112 is deposited on the substrate 150 by Molecular Beam epitaxy (MBE), Solid Phase epitaxy (SPE), Liquid Phase epitaxy (LPE), Vapor Phase epitaxy (VPE), Chemical Vapor Deposition (CVD), etc. The epitaxial layer 112 is considered as a light absorbing layer and is sensitive to light. A material of the epitaxial layer 112 includes silicon, other semiconductor material or other light absorbing materials. In addition, a bulk of the epitaxial layer 112 may be doped to serve as an epitaxial p-Si layer. For example, during depositing the material of the epitaxial layer 112 on the substrate 150, a doping gas such as boron gas is introduced to form the epitaxial layer 112. In some embodiments, a doping range of the bulk of the epitaxial layer 112 may be 1 e11 to 1e20.

Next, a hard mask 152 is formed on the epitaxial layer 112. The hard mask 152 is formed by depositing a mask material such as $SiO_2$, SiC, SiOCH, $Si_3N_4$, TiN, TaN, or the like on the epitaxial layer 112 using Chemical Vapor Deposition (CVD), Sputtering, etc. and patterning the mask material using a mask 153. The mask 153 may be photoresist, $Si_3N_4$, etc., and may be deposited by spin coating and patterned to present a required shape through a lithography process. The hard mask 152 exposes a portion of the epitaxial layer 112 and covers a portion of the epitaxial layer 112. A thickness of the hard mask 152 may be 1 nm to 1 μm and a thickness of the mask 153 may be 1 nm to 1 μm.

An ion implantation is performed after the formation of the hard mask 152 to form a first doped region PD in the epitaxial layer 112. Specifically, the ion implantation includes implanting a first type dopant to the epitaxial layer 112 to form a first doped layer PD1 and then implanting a second type dopant to the epitaxial layer 112 to form a second doped layer PD2 on top of the first doped layer PD1. A dopant type of the first doped layer PD1 and a dopant type of the second doped layer PD2 are different. In some embodiments, the dopant of the first doped layer PD1 includes P, As or the like and the dopant of the second doped layer PD2 includes B, or the like so that the first doped layer PD1 forms a n-well and the second doped layer PD2 forms a P+ layer on top of the n-well.

In some embodiments, a doping range of the first doped layer PD1 (n-well) may be 1e11 to 1e20 and a doping range of the second doped layer PD2 may be 1 e11 to 1e20. A doping depth D1 of doping the first type dopant (forming the first doped layer PD1) is 10 nm-10 μm and a doping depth D2 of doping the second type dopant (forming the second doped layer PD2) is 1 nm-5 μm. In some embodiments, the ion implantation for the first type dopant and the second type dopant may be performed by using a dose of $10^{16}$-$10^{19}$ ions/$cm^2$.

The hard mask 152 and the mask 153 are removed by wet etching or similar process after the formation of the first doped region PD and another hard mask 154 and a corresponding mask 155 are formed on the epitaxial layer 112. An etchant using in the mask removing step includes Buffered-oxide-etch (BOE), formic acid, oxalic acid, etc. The hard mask 154 and the mask 155 may be formed by using similar method as the method of forming the hard mask 152 and the mask 153. The hard mask 154 covers the first doped region PD and exposed another region that is laterally spaced from the first doped region PD. An ion implantation is performed on the epitaxial layer 112 with the hard mask 154 thereon to form a second doped region FD. A dopant type of the second doped region FD may be the same as the dopant type of the first doped layer PD1. In some embodiments, a dopant forming the second doped region FD includes P, As or the like and a doping depth D3 of forming the second doped region FD is 1 nm-5 μm. A doping range of the second doped region FD may be 1 e 11 to 1e20.

After the formation of the second doped region FD, the hard mask 154 and the mask 155 are removed and an interlayer dielectric layer 160 and a gate structure 116A are formed and disposed on the epitaxial layer 112. The interlayer dielectric layer 160 is deposited on the epitaxial layer 112 by atomic layer deposition (ALD), sputtering, Chemical Vapor Deposition (CVD), etc. The interlayer dielectric layer 160 is made of a material such as $SiO_2$, $Si_3N_4$, etc. The thickness of the interlayer dielectric layer 160 may be 1 nm-10 μm. The interlayer dielectric layer 160 is patterned to have a via V1 for forming the gate structure 116A.

The gate structure 116A includes a gate insulator 162, a gate metal 164 and a gate fill material 166. The gate insulator 162, the gate metal 164 and the gate fill material 166 are sequentially deposited on the interlayer dielectric layer 160 in the via V1 and a planarization such as a chemical mechanical polishing (CMP) process or the like is performed to remove excessing material of the gate insulator 162, the gate metal 164 and the gate fill material 166 until the interlayer dielectric layer 160 is exposed to obtain the gate structure 116A embedded in the interlayer dielectric layer 160. The gate insulator 162, the gate metal 164 and the gate fill material 166 may be deposited on the epitaxial layer 112 by atomic layer deposition (ALD), sputtering, Chemical Vapor Deposition (CVD), etc. A material of the gate insulator includes $HfO_2$, $ZrO_2$, $Al_2O_3$, $SiO_2$, etc. A material of the gate metal 164 includes TiN, Al, etc. A material of the gate fill material 166 includes TiN, Al, etc. A thickness of the gate insulator 162 may be 1 nm-5 μm, and a thickness of the gate fill material 166 may be 0.1 nm-5 μm.

After forming the gate structure 116A embedded in the via V1 of the interlayer dielectric layer 160, the interlayer dielectric layer 160 is further patterned to form another via V2 for forming a floating diffusion contact 116B. The floating diffusion contact 116B extends through the interlayer dielectric layer 160 in the via V2 to reach the second doped region FD. The floating diffusion contact 116B may be formed by depositing metal material on the interlayer dielectric layer 160 by atomic layer deposition (ALD), sputtering, Chemical Vapor Deposition (CVD), etc. In addition, after depositing the metal material for forming the floating diffusion contact 116B, a planarization process is performed until the gate structure 116A and the interlayer dielectric layer 160 are exposed to obtain the floating diffusion contact 116B embedded in the interlayer dielectric layer 160. A thickness of the floating diffusion contact 116B may be 1 nm-5 μm. A material of the floating diffusion contact 116B includes TiN, Al, Cu, poly-Si(n) etc. After forming the floating diffusion contact 116B, an interconnect structure 130 is formed and disposed on the sensing structure 110 and particularly, on the interlayer dielectric layer 160. The interconnect structure 130 includes interconnect wirings 132 and interconnect dielectrics 134. The interconnect dielectrics 134 separate different layers of the interconnect wirings 132 to establish required electric transmission paths.

Figures 5A, 5B:
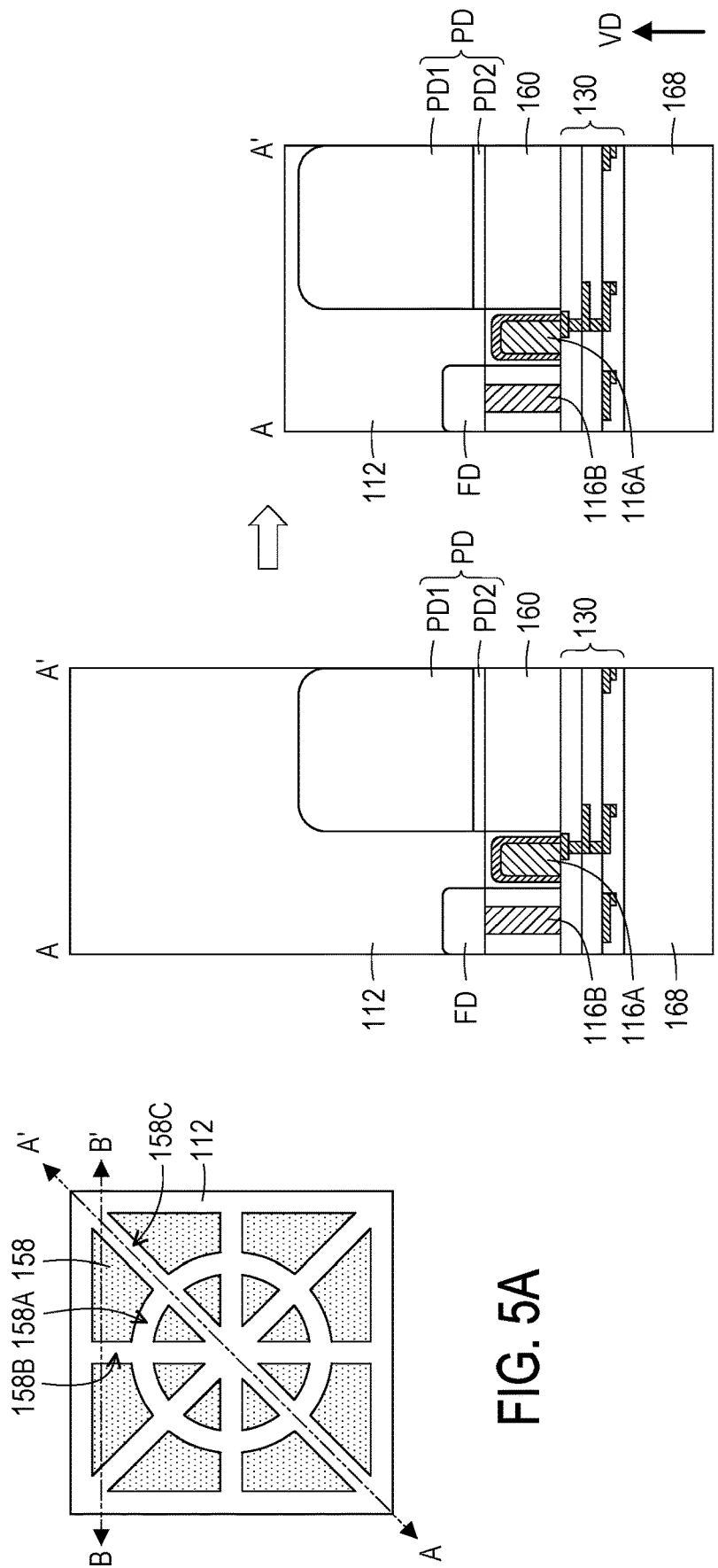
FIG. 5A to FIG. 5C schematically illustrate several steps of fabricating a photosensor in accordance with some embodiments.
Figure 5C:
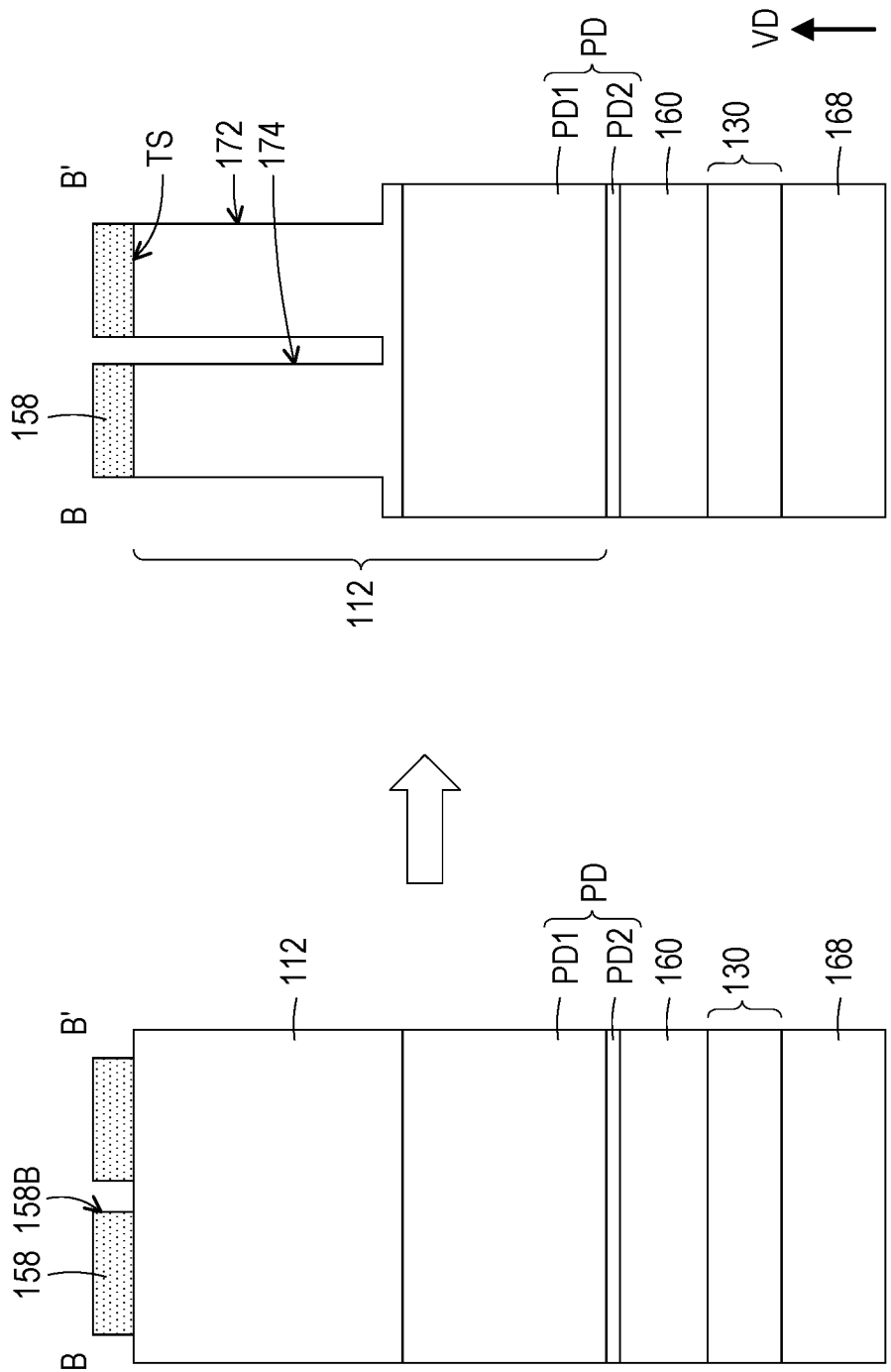

FIG. 5A to FIG. 5C schematically illustrate several steps of fabricating a BSI photosensor after performing the steps of FIG. 4, wherein FIG. 5A shows a top view of the structure, FIG. 5B shows the cross section of the structure in FIG. 5A taken along line A-A' and FIG. 5C shows the cross section of the structure in FIG. 5A taken along line B-B'. As shown in FIG. 5A to FIG. 5C, the fabricated structure of FIG. 4 is transferred to another substrate 168 and separated from the substrate 150. As shown in FIG. 5B and FIG. 5C, the interconnect structure 130 is located between the epitaxial layer 112 and the substrate 168. In some embodiments, the epitaxial layer 112 on the substrate 168 is optionally thinned to have a desirable thickness and a flat surface by using a polishing process, or grinding process. In addition, as shown in FIG. 5A and FIG. 5C, a mask 158 is formed on the epitaxial layer 112.

As shown in FIG. 5A, the mask 158 is disposed on the epitaxial layer 112 to expose a portion of the epitaxial layer 112 and cover another portion of the epitaxial layer 112. The pattern of the mask 158 is determined based on the required scattering structure (such as the scattering structures 118 described in FIG. 2A to 2E). In FIG. 2A, the pattern of the mask 158 may be used for forming the scattering structure 118 in FIG. 2A, as an example. Specifically, the mask 158 defines a first circular ring slot 158A, and traversal pattern slots 158B and 158C. Each of the traversal pattern slots 158B and 158C extends in an extending direction crossing the first circular ring slot 158A, and the extending directions of the traversal pattern slots 158B and 158C are intersected at a center point which is the center of the first circular ring slot 158A.

As shown in FIG. 5B and FIG. 5C. the epitaxial layer 112 is etched with the mask 158 formed thereon by a Reactive-Ion Etching or the like, so that the epitaxial layer 112 is patterned to have a periphery trench 172 and inner trenches 174 surrounded by the periphery trench 172. The etchant for etching the epitaxial layer 112 may include be Buffered-oxide-etch (BOE), formic acid, oxalic acid, etc. The periphery trench 172 is formed to have a frame structure and the inner trenches 174 are formed corresponding to the first circular ring slot 158A and the traversal pattern slots 158B and 158C. A depth of the periphery trench 172 is 10 nm-10 μm. In some embodiments, the depth of the periphery trench 172 may or may not reach the level of the first doped region PD. A depth of the inner trenches 174 is 10 nm-10 μm. In some embodiments, the depth of periphery trench 172 is not less than the depth of the inner trenches 174. In some embodiments, the depth of the periphery trench 172 is different from the inner trenches 174. Now, as shown in FIG. 5C, the epitaxial layer 112 patterned to include the periphery trench 172 extending inwardly from an illuminated surface TS to a predetermined depth without through the whole thickness of the epitaxial layer 112.

Figure 6C:
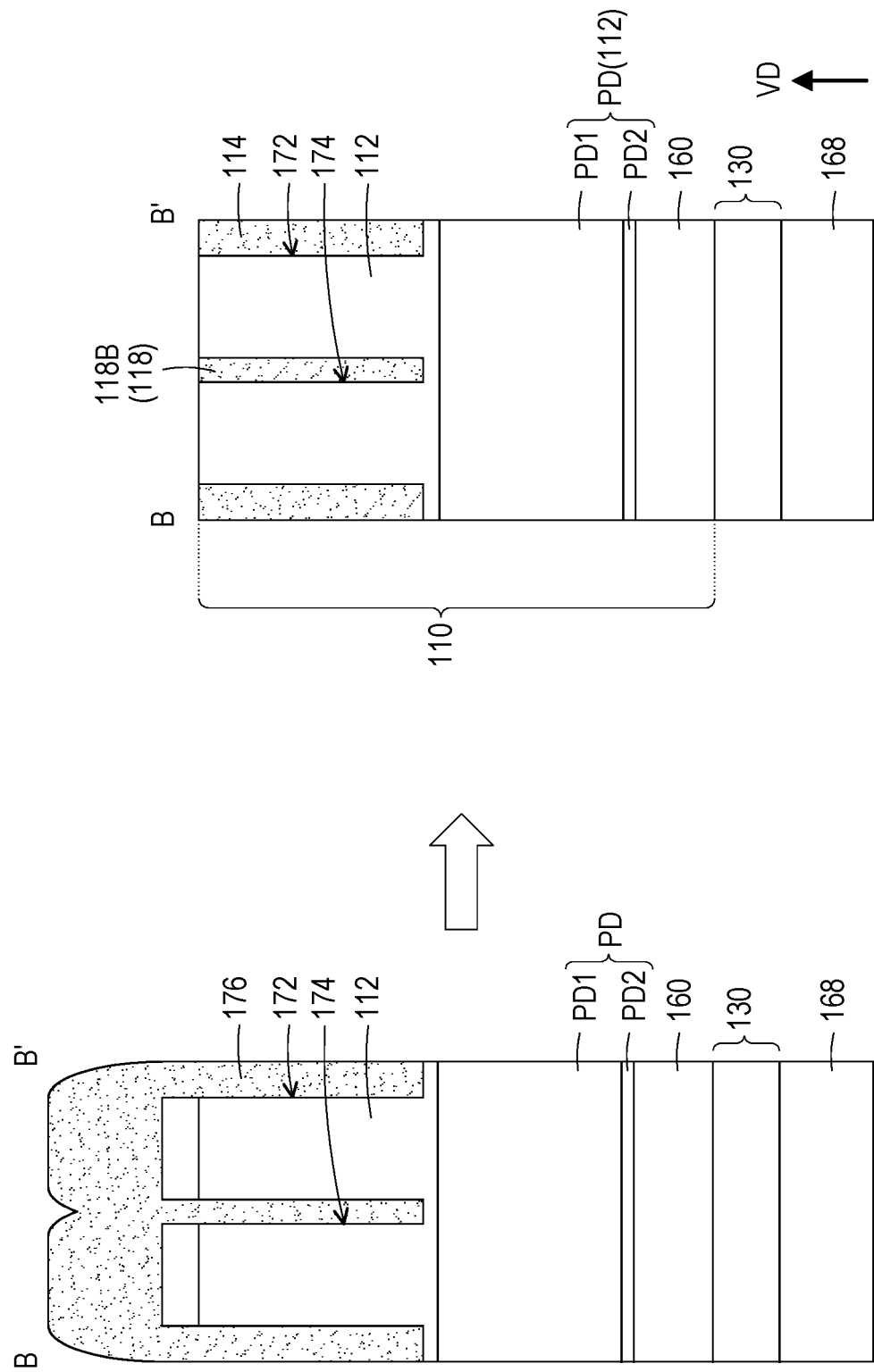

FIG. 6A to FIG. 6C schematically illustrate several steps of fabricating a BSI photosensor after performing the steps of FIG. 5, wherein FIG. 6A shows a top view of the structure, FIG. 6B shows the cross section of the structure in FIG. 6A taken along line A-A' and FIG. 6C shows the cross section of the structure in FIG. 6A taken along line B-B'. The step of FIGS. 6A to 6C is performed after the steps of FIGS. 5A to 5C. As shown in FIGS. 6B and 6C, the mask 158 in FIG. 5A and FIG. 5C is removed to reveal the epitaxial layer 112 and a dielectric material 176 is deposited on the epitaxial layer 112 to completely fill the periphery trench 172 and the inner trenches 174. The dielectric material 176 is deposited by atomic layer deposition (ALD), sputtering, Chemical Vapor Deposition (CVD), etc. In addition, a planarization process is performed to remove excess material of the dielectric material 176 until the epitaxial layer 112 is exposed to obtain the top view shown in FIG. 6A.

As shown in FIGS. 6A to 6C, the dielectric material filling the periphery trench 172 forms a deep trench isolation 114 and the dielectric material filling the inner trenches 174 forms the scattering structure 118. The scattering structure 118 includes a first circular ring pattern 118A and traversal patterns 118B and 118C and may refer to the description of FIG. 2A. The first circular ring pattern 118A is defined based on the pattern of the first circular ring slot 158A in the mask 158 of FIG. 5A and the traversal patterns 118B and 118C are defined based on the patterns of the traversal pattern slots 158B and 158C in the mask 158 of FIG. 5A. Now, the sensing structure 110 is finished.

Figure 7A:
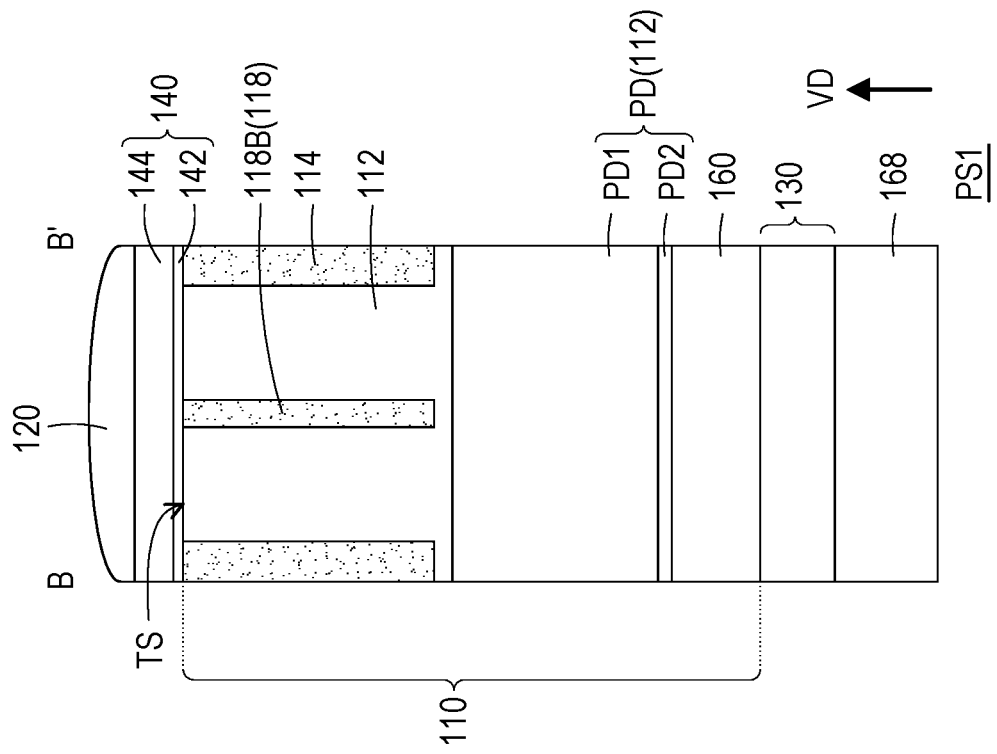
FIG. 7A and FIG. 7B schematically illustrate a photosensor in accordance with some embodiments.
Figure 7B:
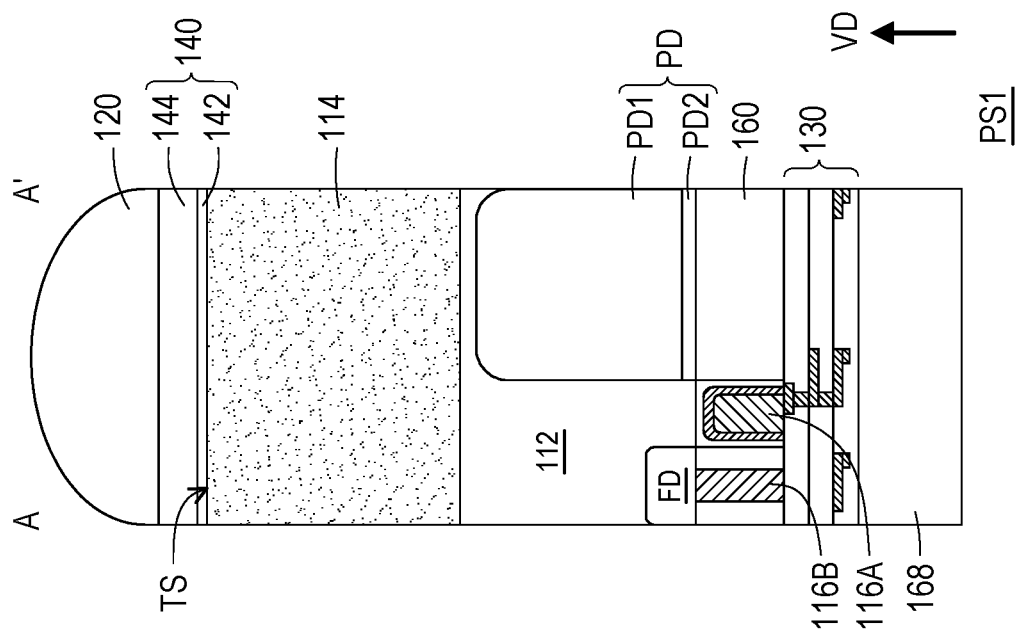

FIG. 7A and FIG. 7B schematically illustrate a BSI photosensor in accordance with some embodiments of the disclosure. A photosensor PS1 in FIG. 7A and FIG. 7B is fabricated by further forming a microlens 120 and an optical layer 140 on the structure shown in FIGS. 6B and 6C respectively. Specifically, the structure of FIG. 7A is obtained from the structure of FIG. 6B which corresponds to the line A-A' of FIG. 6A and the structure of FIG. 7B is obtain from the structure of FIG. 6C which corresponds to the line B-B' of FIG. 6A.

Referring to FIG. 7A and FIG. 7B, the optical layer 140 is formed on the epitaxial layer 112 and the scattering structure 118. The optical layer 140 may include an anti-reflective structure 142 and a color filter 144. The anti-reflective structure 142 may be alternative stacks of $SiO_2$/$TiO_2$. The color filter 144 may be alternative stacks of $SiO_2$/$TiO_2$. In some embodiments, the photosensor PS1 is one of the implemental examples of the photosensor PSA in the photosensor array 100A of FIG. 1A. Specifically, the anti-reflective structure 142 in one photosensor PS1 is the same as the anti-reflective structure 142 in an adjacent photosensor (not shown) while the color filter 144 in one photosensor PS1 is different from the color filter 144 in an adjacent photosensor (not shown). Different color filters 144 provide different filter effect, for example filtering different colors of light. Accordingly, adjacent photosensors PS1 are able to sense different colors of light.

The microlens 120 is formed on the optical layer 140 using a material such as glass, PMMA, AZP, etc. The material of the micro lens 120 is molded or patterned to have a curved surface. The center of the microlens 120 is thicker than the peripheral portion of the microlens 120 and the curved surface of the microlens 120 helps to concentrate the external light to irradiate toward the epitaxial layer 112 so as to enhance the light receiving amount of the photosensor PS1. In FIG. 7A and FIG. 7B, the photosensor PS1 includes the sensing structure 110, the microlens 120, the interconnect structure 130, and the substrate 168. The sensing structure 110 includes the epitaxial layer 112, the deep trench isolation 114, the interlayer dielectric layer 160, the gate structure 116A, the floating diffusion contact 116B, the scattering structure 118. The deep trench isolation 114 surrounds the edge of the epitaxial layer 112. The scattering structure 118 is embedded in the epitaxial layer 112 and extends inwardly from the illuminated surface TS. The epitaxial layer 112 includes a first doped region PD and a second doped region FD that are formed close to the non-illuminated surface BS and between the scattering structure 118 and the substrate 168. The first doped region PD and the second doped region FD are laterally spaced from each other by a gap G. The interlayer dielectric layer 160 is disposed on the epitaxial layer 112 opposite to the scattering structure 118. The floating diffusion contact 116B and the gate structure 116A are embedded in the interlayer dielectric layer 160. The gate structure 116A is located corresponding to the gap G between the first doped region PD and the second doped region FD. The floating diffusion contact 116B extend through the interlayer dielectric layer 160 to reach and contact the second doped region FD. In some embodiments, the first doped region PD includes a first doped layer PD1 with a first type dopant and a second doped layer PD2 with a second type dopant to function as a photo diode, and the second doped region FD may be doped with the same type dopant with the first doped layer PD1 to serve as a floating diffusion.

In the photosensor PS1, the scattering structure 118 has a complicate pattern such as the scattering structures 118 shown in any of FIGS. 2A to 2E or similar pattern. The scattering structure 118 and the epitaxial layer 112 are made of different material and an incoming light would be refracted at the interface between the scatter structure 118 and the epitaxial layer 112, which helps to increase the travel length of light in the epitaxial layer 112. Accordingly, the quantum efficiency of the sensing structure 110 is improved through at least the complicate pattern of the scattering structure 118.

FIG. 8-FIG. 13 schematically illustrate a step of fabricating a FSI photosensor in accordance with some embodiments of the disclosure. FIG. 8A shows a top view of the structure and FIG. 8B shows a cross section of the structure of FIG. 8A taken along the line C-C'. As shown in FIG. 8A and FIG. 8B, an epitaxial layer 112 is deposited on the substrate 150 and a deep trench isolation 114 is formed in the epitaxial layer 112. The deposition of the epitaxial layer 112 may refer to the description of FIG. 4 and is not reiterated here. In the embodiment, the epitaxial layer 112 is patterned to have the periphery trench 172 by an etching process and a dielectric material is deposited on the epitaxial layer 112 to fill the periphery trench 172. In addition, the excess material of the dielectric material is removed through a CMP process or the like to expose the epitaxial layer 112 and form the deep trench isolation 114. The dimension and the structure of the deep trench isolation 114 may refer to the previous embodiments. In FIG. 8A, the deep trench isolation 114 forms a rectangular ring surrounding the epitaxial layer 112. As described in above, the deep trench isolation 114 may define the pixel of the photosensor.

FIGS. 9A and 9B schematically illustrate a step of fabricating a FSI photosensor after performing the step of FIG. 8. FIG. 9A shows a top view of the structure and FIG. 9B shows a cross section of the structure of FIG. 9A taken along the line C-C'. The structure of FIGS. 9A and 9B is obtained by forming a hard mask 178 on the structure of FIG. 8A and FIG. 8B. The hard mask 178 may have a specific pattern to expose a portion of the epitaxial layer 112 and cover the other portion of the epitaxial layer 112. In some embodiments, the hard mask 178 is patterned by etching a hard mask material layer covered by a mask 179 such as a photoresist pattern. After patterning the hard mask material layer to form the hard mask 178, the mask 179 is removed by, for example, a striping process or the like.

In addition, an ion implantation is performed on the epitaxial layer 112 with the hard mask 178 thereon to form a first doped region PD in the exposed portion of the epitaxial layer 112. Specifically, the ion implantation includes implanting a first type dopant to the epitaxial layer 112 to form a first doped layer PD1 and then implanting a second type dopant to the epitaxial layer 112 to form a second doped layer PD2 stacking on the first doped layer PD1. In some embodiments, the first type dopant includes P, As or the like and the second type dopant includes B, or the like so that the first doped layer PD1 forms a N-well and the second doped layer PD2 forms a P+ layer on top of the N-well.

Figure 10B:
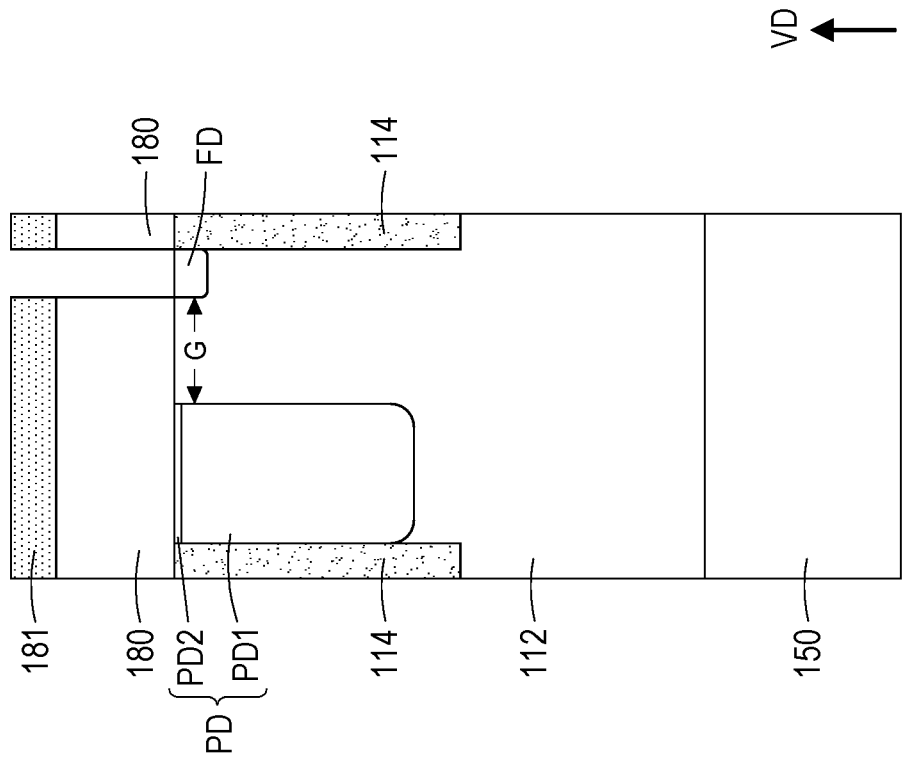
FIGS. 10A and 10B schematically illustrate a step of fabricating a photosensor in accordance with some embodiments of the disclosure.
Figure 10A:
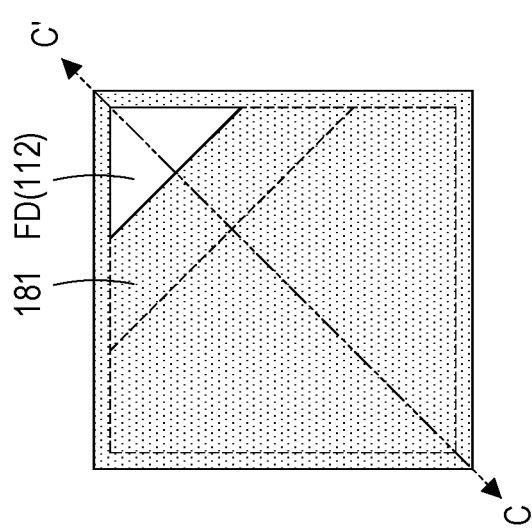

After forming the first doped region PD, the hard mask 178 as well as the mask 179 are removed and another hard mask 180 covered by another mask 181 is formed on the epitaxial layer 112 as shown in FIG. 10A and FIG. 10B. FIGS. 10A and 10B schematically illustrate a step of fabricating a FSI photosensor after performing the step of FIG. 9. FIG. 10A shows a top view of the structure and FIG. 10B shows a cross section of the structure of FIG. 10A taken along the line C-C'. The pattern of the mask 181 is different from the pattern of the mask 179 and the hard mask 180 exposes another portion of the epitaxial layer 112 outside the doped region PD. In addition, an ion implementation is performed on the epitaxial layer 112 with the hard mask 180 thereon to form a second doped region FD by a gap G. The first doped region PD and the second doped region FD are laterally spaced from each other.

Figure 11A:
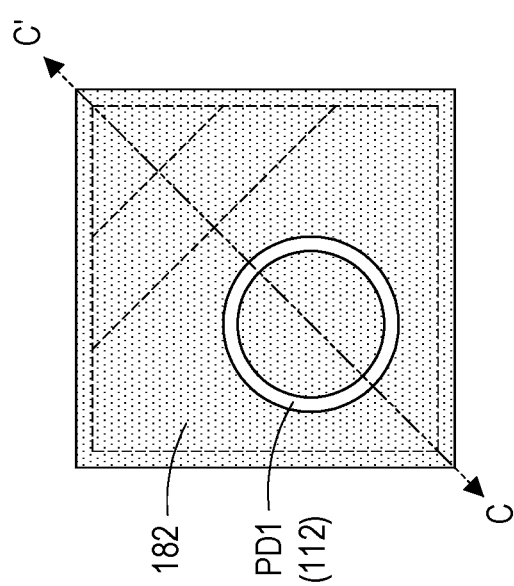
FIGS. 11A and 11B schematically illustrate a step of fabricating a photosensor in accordance with some embodiments of the disclosure.
Figure 11B:
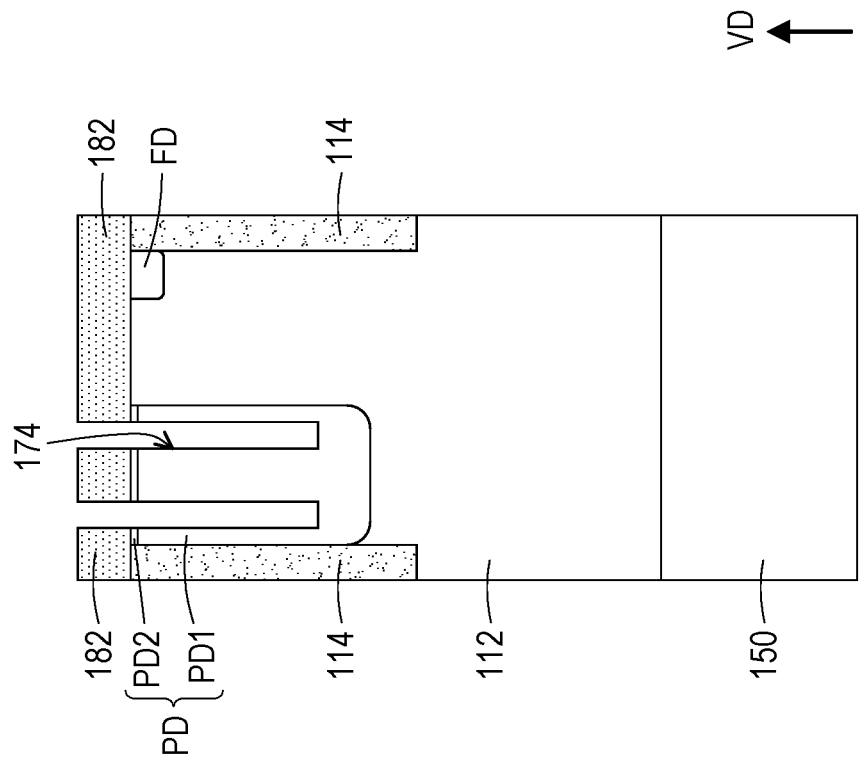

After forming the second doped region FD, the hard mask 180 and the mask 181 are removed, and a further mask 182 is formed on the epitaxial layer 112 to pattern the epitaxial layer 112 as shown in FIG. 11A and FIG. 11B. FIG. 11A shows a top view of the structure and FIG. 11B shows a cross section of the structure of FIG. 11A taken along the line C-C'. In FIG. 11A and FIG. 11B, the epitaxial layer 112 covered by the mask 182 is patterned by an etching process such as Reactive-ion etching (RIE) or the like to form the inner trench 174. The inner trench 174 is located at the first doped region PD and extends to a depth without passing through the first doped region PD, but the disclosure is not limited thereto. In FIG. 11A, the first doped region PD1 is exposed at the inner trench 174. The pattern of the inner trench 174 is simplified to present one circular ring pattern for illustrative purpose. In some embodiments, the pattern of the inner trench 174 may be corresponding to or the same as the patterns of the scattering structures 118 shown in any of FIG. 2A to FIG. 2E.

After forming the inner trench 174, the mask 182 is removed, a dielectric material is deposited on the epitaxial layer 112 and a planarization process is performed to form a scattering structure 118 filling the inner trench 172 of the epitaxial layer 112 and also form an interlayer dielectric layer 160 covering the epitaxial layer 112, as shown in FIG. 12A and FIG. 12B. The scattering structure 118 in FIG. 12A and FIG. 12B may be an implemental example of the first circular ring pattern 118A shown in FIG. 2A to FIG. 2B or the second circular ring pattern 118F shown in FIG. 2D and FIG. 2E. In the embodiment, the interlayer dielectric layer 160 and the scattering structure 118 are formed by the same deposition process, but the disclosure is not limited thereto. In some embodiments, the interlayer dielectric layer 160 may be formed after the formation of the scattering structure 118 through a further deposition process.

Figure 13A:
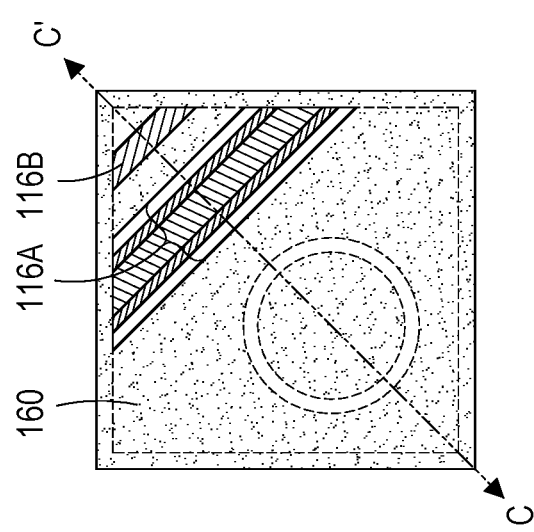
FIGS. 13A and 13B schematically illustrate a step of fabricating a photosensor in accordance with some embodiments of the disclosure.
Figure 13B:
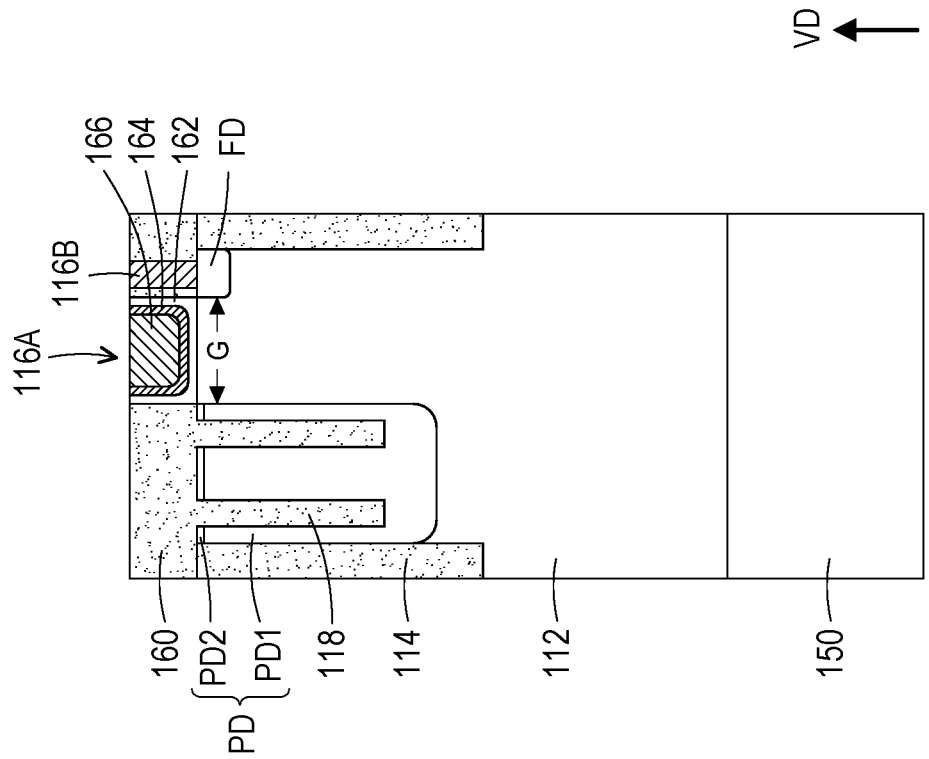

FIGS. 13A and 13B schematically illustrate a step of fabricating a FSI photosensor after performing the step of FIG. 12. FIG. 13A shows a top view of the structure and FIG. 13B shows a cross section of the structure of FIG. 13A taken along the line C-C'. As shown in FIG. 13A and FIG. 13B, a gate structure 116A and a floating diffusion contact 116B are formed on the structure of FIG. 12A and FIG. 12B and embedded in the interlayer dielectric layer 160. Similar to the embodiment shown in FIG. 4, the gate structure 116A includes a gate insulator 162, a gate metal 164 and a gate fill material 166 and is located corresponding to the gap G between the first doped region PD and the second doped region FD. The floating diffusion contact FD extends through the interlayer dielectric layer 160 to reach the second doped region FD. In addition, a planarization process is performed so that the tops of the interlayer dielectric layer 160, the gate structure 116A and the floating diffusion contact 116 are coplanar.

Figure 14:
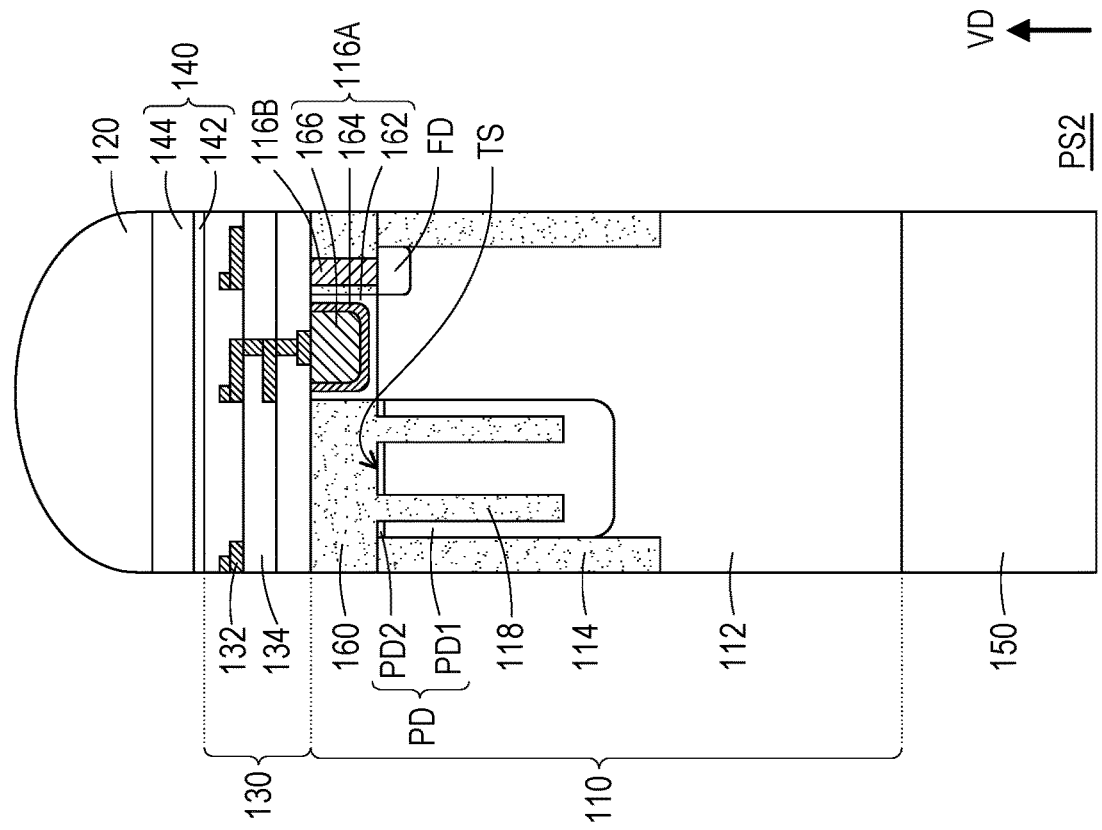
FIG. 14 schematically illustrate a cross section of a photosensor in accordance with some embodiments of the disclosure.

FIG. 14 schematically illustrates a cross section of a FSI photosensor in accordance with some embodiments of the disclosure. In FIG. 14, a photosensor PS2 is fabricated by further forming an interconnect structure 130, an optical layer 140 and a microlens 120 on the structure of FIG. 13A and FIG. 13B. Accordingly, the same reference numbers in FIG. 14 and FIGS. 13A and 13B refer to the same components. Specifically, the photosensor PS2 may include a substrate 150, a sensing structure 110, a micorlens 120, an interconnect structure 130, and an optical layer 140. The sensing structure 110 is disposed on the substate 150. The interconnect structure 130 is disposed on the sensing structure 110 and the sensing structure 110 is between the interconnect structure 130 and the substrate 150. The optical layer 140 is disposed on the interconnect structure 130 and the microlens 120 is disposed on the optical layer 140. The optical layer 140 is thus between the microlens 120 and the sensing structure 110.

The sensing structure 110 may include an epitaxial layer 112, a deep trench isolation 114, a scattering structure 118, a gate structure 116A, a floating diffusion contact 116B and an interlayer dielectric layer 160. The epitaxial layer 112 has a first doped region PD and a second doped region FD, the first doped region PD includes a first doped layer PD1 and a second doped layer PD2 formed at top of the first doped layer PD1, and the second doped region FD is laterally spaced from the first doped region PD, such that the sensing structure 110 functions as a photodiode capable of absorbing photon to produce current.

The deep trench isolation 114 has a wall-like structure surrounding the photosensor PS2 to define a pixel of the photosensor PS2. A depth of the deep trench isolation 114 is smaller than the thickness of the epitaxial layer 112 and the deep trench isolation 114 may extend from an illuminated surface TS of the epitaxial layer 112 without through the thickness of the epitaxial layer 112. The first doped region PD and the second doped region FD are disposed close to the illuminated surface TS. In addition, the scattering structure 118 is embedded in the epitaxial layer 112 and a top of the scattering structure 118 is coplanar with a top (i.e. the illuminated surface TS) of the epitaxial layer 112. Specifically, the scattering structure 118 may be embedded in the first doped region PD as shown in FIG. 14.

The interlayer dielectric layer 160 is formed on the epitaxial layer 112 and covers the deep trench isolation 114, the first doped region PD, the second doped region FP and the scattering structure 118. The gate structure 116A and the floating diffusion contact 116B are disposed and embedded in the interlayer dielectric layer 160. The fabrication and the material of the interlayer dielectric layer 160, the gate structure 116A and the floating diffusion contact 116B may refer to the description of FIG. 4. The gate structure 116A includes a gate insulator 162, a gate metal 164 and a gate fill material 166. The gate structure 116A is positioned corresponding to the gap between the first doped region PD and the second doped region FD. The gate insulator 162 is a dielectric layer in contact with the epitaxial layer 112 so that the conductive material such as the gate metal 164 and the gate fill material 166 would not contact the epitaxial layer 112. The floating diffusion contact 116B is in contact with the second doped region FD.

The interconnect structure 130 is disposed on the sensing structure 110 between the optical layer 140 and the sensing structure 110. The interconnect structure 130 includes interconnect wirings 132 and interconnect dielectrics 134. The interconnect dielectrics 134 separate different layers of the interconnect wirings 132 to establish the required electric transmission paths. In some embodiments, the material of the interconnect wirings 134 may include Al, Cu, etc. The fabrication and the material of the interconnect structure 130 may refer to the descriptions of FIG. 4.

The optical layer 140 is disposed between the microlens 120 and the epitaxial layer 110. The optical layer 140 may include an anti-reflective structure 142 formed by stacks of $SiO_2/TiO_2$. The optical layer 140 may further include a color filter 144. In some embodiments, the color filter 144 may be alternative stacks of $SiO_2/TiO_2$ and the stacks of $SiO_2/TiO_2$ in one photosensor PSA is different from the stacks of $SiO_2/TiO_2$ in an adjacent photosensor PSA to filter different wavelength of light so that different photosensors PSA is sensitive to different wavelengths of light.

The microlens 120 is disposed above the sensing structure 110 and has a curved surface for refracting the incoming external light to travel to the sensing structure 110 so that the microlens 120 helps to improve the light receiving amount of the sensing structure 110. In some embodiments, the material of the microlens 120 may include, but not limited to, glass, PMMA, AZP, etc.

The scattering structure 118 of the photosensor PS2 further includes traversal patterns and peripheral patterns depicted in FIGS. 2A to 2E in addition to the circular ring pattern though FIGS. 8A to 14 do not show other patterns of the scattering structure 118 for illustrative purpose. Therefore, the scattering structure 118 of the photosensor PS2 has a complicate pattern and may be applicable to implement the photosensor PSB in FIG. 1B. In the embodiment, the interconnect structure 130 is more adjacent to the microlens 120 than the sensing structure 110. Some of the incoming light may be reflected by the interconnect wirings 132 of the interconnect structure 130 since the interconnect wirings 132 is formed by metallic material, which could limit the amount of the light entering the sensing structure 110. However, the scattering structure 118 of the sensing structure 110 has a complicate pattern capable of improving the quantum efficiency of the sensing structure 110 in the photosensor PS2 so that the sensitivity of the photosensor PS2 is desirable.

In view of the above, the photosensor in the embodiments of the disclosure has a scattering structure formed in the epitaxial layer. The scattering structure includes at least a circular ring pattern and traversal patterns passing through the circular ring pattern. The scattering structure with complicate pattern helps to scattering the incoming light so that the travel path (optical path length) of the light travelling in the epitaxial layer is lengthened to enhance the quantum efficiency and improve the sensitivity of the photosensor.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A photosensor, comprising:
   a sensing structure including:
   an epitaxial layer having an illuminated surface and a non-illuminated surface;
   a deep trench isolation located along an edge of the epitaxial layer;
   a scattering structure embedded in the epitaxial layer and extending inwardly from the illuminated surface, wherein the scattering structure comprises a first circular ring pattern and a peripheral pattern, wherein the deep trench isolation surrounds the scattering structure, the peripheral pattern is connected with the deep trench isolation and the first circular ring pattern is separated from the peripheral pattern and the deep trench isolation; and
   a microlens disposed on the sensing structure, wherein the illuminated surface of the epitaxial layer is relatively close to the microlens than the non-illuminated surface.

2. The photosensor according to claim 1, wherein a material of the scattering structure is different from the epitaxial layer.

3. The photosensor according to claim 1, wherein the scattering structure has taper sidewalls.

4. The photosensor according to claim 1, wherein a depth of the deep trench isolation is not less than a depth of the scattering structure.

5. The photosensor according to claim 1, wherein the scattering structure further comprises a second circular ring pattern, wherein the first circular ring pattern and the second circular ring pattern are centered at a center point, and a radius of the first circular ring pattern is different from a radius of the second circular ring pattern.

6. The photosensor according to claim 1, wherein the scattering structure further comprises a traversal pattern extending in an extending direction traversing the first circular ring pattern, and the first circular ring pattern is centered at a center point and the traversal pattern extends across the center point.

7. The photosensor according to claim 6, wherein the peripheral pattern is located at a terminal of the traversal pattern.

8. The photosensor according to claim 6, wherein the traversal pattern extends along the extending directions substantially parallel to a side edge of the sensing structure.

9. The photosensor according to claim 6, wherein the traversal pattern extends along an extending direction substantially parallel to a diagonal line of the sensing structure.

10. The photosensor according to claim 6, wherein terminals of the traversal pattern are connected to the deep trench isolation.

11. The photosensor according to claim 1, wherein the epitaxial layer comprises a first doped region and a second doped region laterally spaced from the first doped region by a gap.

12. The photosensor according to claim 11, wherein the sensing structure further comprises a gate structure and a floating diffusion contact, the gate structure is disposed on the epitaxial layer and located corresponding to the gap between the first doped region and the second doped region and the floating diffusion contact is disposed on the epitaxial layer and in contact with the second doped region.

13. The photosensor according to claim 12, further comprising an interconnect structure, wherein the interconnect structure is electrically connected to the gate structure and the floating diffusion contact.

14. The photosensor according to claim 12, wherein the first doped region and the second doped region are disposed close to the non-illuminated surface of the epitaxial layer.

15. The photosensor according to claim 12, wherein the first doped region and the second doped region are disposed close to the illuminated surface of the epitaxial layer.

16. The photosensor according to claim 15, wherein the scattering structure is embedded in the first doped region.

17. The photosensor according to claim 11, wherein the first doped region comprises a first doped layer and a second doped layer on top of the first doped layer, and a dopant type of the first doped layer and a dopant type of the second doped layer are different.

18. The photosensor according to claim 17, wherein a dopant type of the second doped region is the same as the dopant type of the first doped layer.

19. The photosensor according to claim 1, further comprising an optical layer disposed between the microlens and the sensing structure.

20. The photosensor according to claim 1, wherein a top of the scattering structure is coplanar with a top of the epitaxial layer.

* * * * *